United States Patent [19]
Franchville

[11] Patent Number: 5,949,236
[45] Date of Patent: Sep. 7, 1999

[54] FREQUENCY DOMAIN REFLECTOMETER AND METHOD OF COMPENSATING FOR TRANSMISSION LINE ATTENUATION

[75] Inventor: Douglas J. Franchville, Indianapolis, Ind.

[73] Assignee: Wavetek Corporation, Indianapolis, Ind.

[21] Appl. No.: 08/982,535

[22] Filed: Dec. 2, 1997

[51] Int. Cl.[6] .................................................. G01R 31/11
[52] U.S. Cl. ........................ 324/533; 324/534; 324/539; 702/59; 379/26
[58] Field of Search ................................... 324/527, 528, 324/533, 534, 539, 542, 642, 645, 646, 647, 607; 379/1, 24, 26; 702/58, 59

[56] References Cited

U.S. PATENT DOCUMENTS

| | | | |
|---|---|---|---|
| 4,630,228 | 12/1986 | Tarczy-Hornoch et al. | 324/542 |
| 4,739,276 | 4/1988 | Graube | 324/642 |
| 4,766,386 | 8/1988 | Oliver et al. | 324/533 |
| 5,128,619 | 7/1992 | Bjork et al. | 324/533 |
| 5,498,965 | 3/1996 | Mellitz | 324/532 |

*Primary Examiner*—Diep Do
*Attorney, Agent, or Firm*—Maginot, Addison & Moore

[57] ABSTRACT

Frequency domain reflectometer and method of determining severity of faults in a transmission line are disclosed. The reflectometer compensates for attenuation effects in the transmission line when determining severity of faults. In general, the reflectometer applies a sweep signal to the transmission line in order to obtain a reflected sweep response signal. Then, the reflectometer obtains a sweep response spectrum from the reflected sweep response signal. The reflected sweep response signal includes a plurality of spectral peaks which represent the frequency components of the reflected sweep response signal. Then, the reflectometer determines a first attenuation compensation factor for a first spectral peak of the reflected sweep response spectrum. Furthermore, the reflectometer adjusts the reflected sweep response spectrum for effects due to attenuation in the transmission line by applying the attenuation compensation factor to the first spectral peak, thus compensating the reflected sweep response spectrum for attenuation within the transmission line. The reflectometer then obtains from the adjusted sweep response spectrum severity of an impedance mismatch in the transmission line.

23 Claims, 10 Drawing Sheets

FREQUENCY DOMAIN REFLECTOMETER AND METHOD OF COMPENSATING FOR TRANSMISSION LINE ATTENUATION

FIELD OF THE INVENTION

The present invention relates generally to compensating for attenuation effects of a transmission line, and more particularly, to a frequency domain reflectometer that compensates for attenuation effects in determining severity of impedance mismatches in a transmission line.

BACKGROUND OF THE INVENTION

Community Antenna Television ("CATV") systems are used in a widespread manner for the transmission and distribution of television signals to end users, or subscribers. In general, CATV systems comprise a transmission subsystem and a distribution subsystem. The transmission subsystem obtains television signals associated with a plurality of CATV channels and generates a broadband CATV signal therefrom. The distribution subsystem then delivers the CATV broadband signal to television receivers located within the residences and business establishments of subscribers. The complexity and size of the distribution subsystem requires that operation and performance be periodically tested and/or monitored.

One test often performed by CATV service providers in order to pinpoint problems in the distribution subsystem is fault detection. Fault detection refers to the process of locating faults within the distribution subsystem such as breaks, shorts, discontinuities, degraded components, and improperly terminated transmission lines. Faults within the distribution subsystem are typically characterized by an impedance mismatch. In other words, the impedance of the fault is typically different than the characteristic impedance of the transmission lines of the distribution subsystem. For example, transmission lines in a CATV distribution subsystem typically have an impedance of approximately 75 ohms; however, a short on the transmission line would have an approximately zero impedance and a break would have an approximately infinite impedance.

One problem with faults in the distribution subsystem is that faults, due to their impedance mismatch characteristics, reflect signals transmitted through the distribution subsystem. As a result, beyond cutting off portions of the distribution subsystem in the case of a short or a break, faults in the distribution subsystem may also cause problems throughout the distribution subsystem due to interference from reflected signals. Therefore, it is important for CATV service providers to be able to locate faults within the network in order to repair the fault to not only cure reception problems of a single subscriber but to remove fault generated interference from the distribution subsystem as a whole. While impedance mismatches within the distribution subsystem may interfere with CATV signals, some impedance mismatches due to their severity may not generate enough interference to justify the cost of repair. As a result, CATV service provides also need information concerning the severity of the impedance mismatch.

One way of determining location and severity of faults within the distribution subsystem is to perform frequency domain reflectometry upon the distribution subsystem. Frequency domain reflectometry utilizes a reflectometer that applies a sweep signal to the distribution subsystem. The sweep signal is an RF signal that is swept from a start frequency to a stop frequency. If an impedance mismatch exists within the distribution subsystem, the impedance mismatch will reflect each transmitted signal back to the reflectometer at the same frequency as the transmitted signal but retarded in phase. As a result of this reflection, a standing wave is generated. The reflectometer measures the level of the standing wave at each swept frequency in order to obtain a reflected sweep response signal. The retardation of the reflected sweep response signal is such that the minimums of the reflected wave will align to ½ the wavelength of the impedance mismatch from the reflectometer. Due to this known relationship, the reflectometer may determine the distance from the reflectometer of the impedance mismatch.

To this end, the reflectometer may perform spectral analysis upon the reflected sweep response signal in order to obtain a reflected sweep response spectrum having a plurality of spectral peaks. Each spectral peak includes a frequency and a magnitude that together represent a sinusoidal component of the reflected sweep response spectrum. The reflectometer may apply the above wavelength relationship to the frequency of a spectral peak in order to determine distance from the reflectometer of an impedance mismatch within the transmission line. Furthermore, the reflectometer may determine severity of the impedance mismatch from the magnitude of the spectral peak.

One problem associated with the above reflectometry system is the failure to account for loss due to attenuation within the transmission line. Transmission lines generally dampen the magnitude of sinusoidal signals that are traveling through the transmission line as a function of distance and as a function of the square root of the frequency. As a result of this dampening, the magnitude of the spectral peak should actually be greater in magnitude in order to accurately represent the severity of the impedance mismatch. Therefore, if the reflectometer fails to account for this loss due to attenuation, the reflectometer may indicate that an impedance mismatch is not severe enough to require repair even though the impedance mismatch actually is severe enough.

Accordingly, there is a need for a reflectometer that accounts for attenuation effects when determining severity of impedance mismatches within a transmission line. However, the effect of attenuation on the magnitude of a spectral peak has no closed form. As a result, determination of an appropriate attenuation compensation factor for a spectral peak may be computationally intensive. In order to support a computationally intensive function, a reflectometer may need advanced processing circuitry thus adding to the cost of the reflectometer. Accordingly, there is also a need for a reflectometer that determines an appropriate attenuation compensation factor in a non-computationally intensive manner.

SUMMARY OF THE INVENTION

The present invention fulfills the above need, as well as others, by providing a frequency domain reflectometer that compensates for attenuation effects within the system under test when determine severity of a fault. In general, the reflectometer obtains a reflected sweep response spectrum that includes a plurality of spectral peaks which represent the frequency components of the reflected sweep response signal. Then, the reflectometer adjusts magnitudes of the spectral peaks for effects due to attenuation in the system under test. The reflectometer adjusts the magnitudes by applying a separate attenuation compensation factor to each spectral peak of the reflected sweep response spectrum. The reflectometer may obtain the attenuation compensation factor in a variety of ways. For example, the reflectometer may (i) calculate the attenuation compensation factor for each spectral peak, (ii) calculate at least one attenuation compensation factor and interpolate the remaining attenuation compensation factors from the calculated attenuation compensation factor, and (iii) obtain at least one attenuation compensation factor from a table of attenuation compensation factors and interpolate the remaining attenuation compensation factors from the obtained attenuation compensation factor.

An exemplary method according to the present invention is a method of determining severity of impedance mismatches in a system under test. One step of the method includes the step of applying a test sweep signal to the system under test in order to obtain a reflected sweep response signal from the system under test. The reflected sweep response signal representative of a frequency response of the system under test. Another step of the method includes the step of generating from the reflected sweep response signal a reflected sweep response spectrum that includes a plurality of spectral peaks. The method also includes the step of determining a first attenuation compensation factor for a first spectral peak of the plurality of spectral peaks. Furthermore, the method includes the step of adjusting the reflected sweep response spectrum for effects due to attenuation in the system under test in order to obtain an adjusted sweep response spectrum by applying the attenuation compensation factor to a first magnitude of the first spectral peak. Finally, the method also includes the step of obtaining from the adjusted sweep response spectrum a severity of an impedance mismatch in the system under test.

The present invention further includes various apparatus for carrying out the above method. For example, one apparatus according to the present invention includes a connector, a transmitter circuit, a measurement circuit, an analog-to-digital (A/D) converter, and a digital signal processing (DSP) circuit. The connector is configured to couple the system under test to the apparatus. The transmitter circuit is coupled to the connector and is configured to apply a test sweep signal to the connector and the system under test coupled thereto. The reflected sweep response signal representative of a frequency response of the system under test. The measurement circuit is coupled to the connector and is configured to generate a plurality of measurement signals indicative of a resultant response signal. The resultant response signal includes (i) the test sweep signal from the transmitter circuit and (ii) the reflected sweep response signal received from the system under test coupled to the connector. The A/D converter is coupled to the measurement circuit and is configured to generate from the plurality of measurement signals a digitized resultant response signal that is a digital representation of the resultant response signal.

The DSP circuit is coupled to the A/D converter and is configured to (i) obtain the reflected sweep response signal from the digitized resultant response signal, (ii) generate from the reflected sweep response signal a reflected sweep response spectrum that includes a plurality of spectral peaks, and (iii) determine a first attenuation compensation factor for a first spectral peak of the plurality of spectral peaks. The DSP circuit is also further configured to (i) adjust the reflected sweep response spectrum for effects due to attenuation in the system under test in order to obtain an adjusted sweep response spectrum by applying the attenuation compensation factor to a first magnitude of the first spectral peak, and (ii) obtain from the adjusted sweep response spectrum a severity of an impedance mismatch in the system under test. The first spectral peak corresponds to a first distance traveled through the system under test. Furthermore, the first attenuation compensation factor accounts for attenuation of a plurality of signals at different frequencies traveling the first distance through said system under test.

The above features and advantages, as well as others, will become more readily apparent to those of ordinary skill in the art by reference to the following detailed description and accompanying drawings.

DETAILED DESCRIPTION

Figure 1:
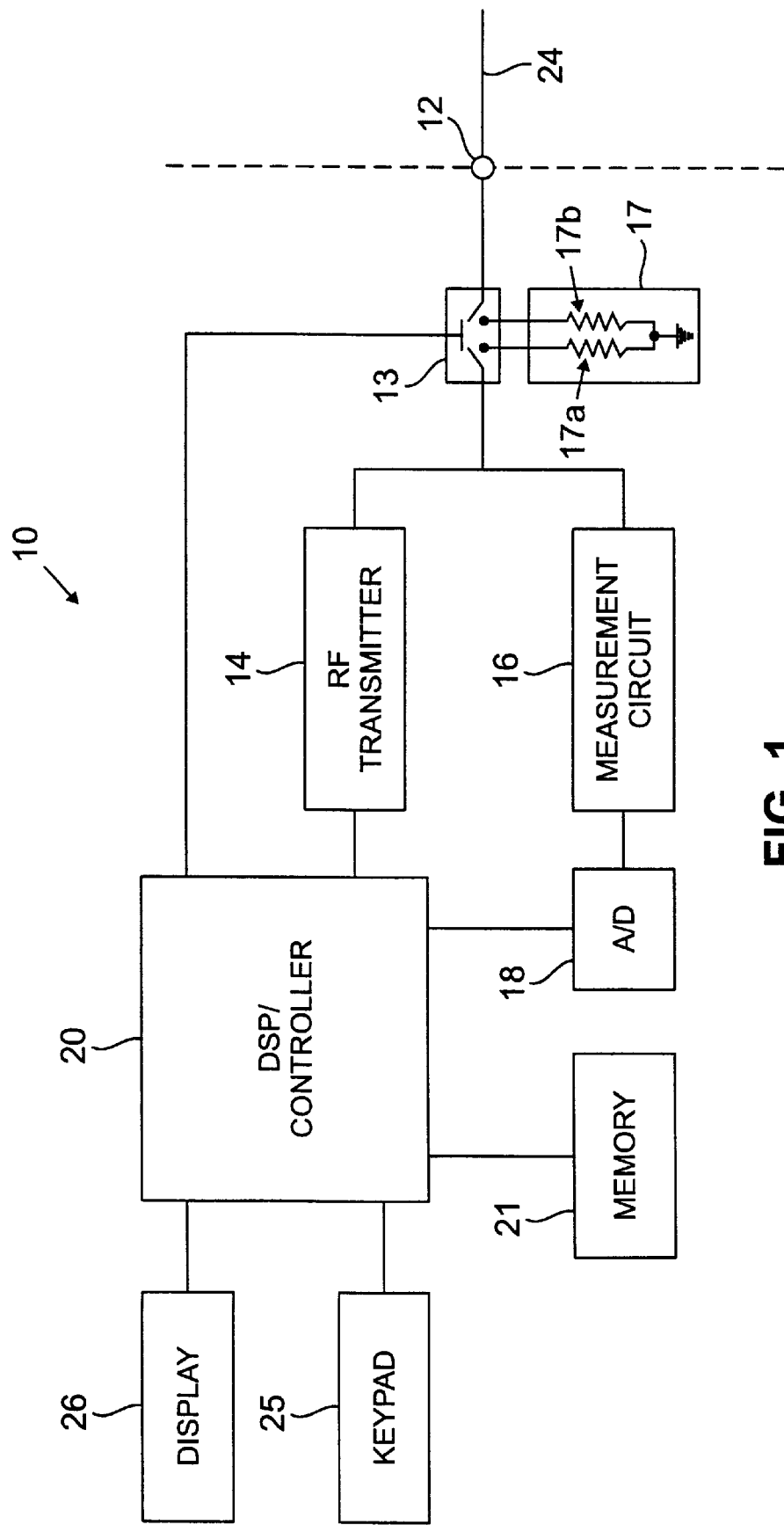
FIG. 1 shows a frequency domain reflectometer that incorporates various features of the present invention.

FIG. 1 shows a simplified diagram of a frequency domain reflectometer ("reflectometer") 10 that incorporates various features of the present invention therein. The reflectometer 10 includes a RF connector 12, a coupling device 13, a radio frequency ("RF") transmitter 14, a measurement circuit 16, a reference impedance 17, an analog-to-digital ("A/D") converter 18, a digital signal processing and controller circuit ("DSP/controller") 20, a memory 21, a keypad 25, and a display 26. The RF connector 12 is operable to couple the reflectometer 10 to a transmission line 24 under test, such as a coaxial cable of a subscriber network.

The RF transmitter 14 is connected to the RF connector 12 via the coupling device 13. The RF transmitter 14 is an RF circuit operable to generate RF signals including a sweep signal, wherein the sweep signal is an RF test signal in which the frequency of the RF test signal is swept over time over a predetermined frequency range. The RF transmitter 14 is furthermore operable to generate the sweep signal in accordance with a sweep control signal received from the DSP/controller 20. In particular, the RF transmitter 14 is operable to generate a sweep signal that includes a first segment at a start frequency Fstart, a second segment at the start frequency Fstart plus a frequency increment freq_inc (Fstart+freq_inc), a third segment at the start frequency Fstart plus two times the frequency increment freq_inc (Fstart+2*freq_inc), on so on, and including a last segment at a stop frequency Fstop. For example, the RF transmitter 14 in response to control signals received from the DSP/controller 20 may generate a sweep signal that includes a first segment at 5 MHz, then a second segment at 5.075 MHz, then a third segment at 5.015 MHz, and so forth, and including a last segment at 81.8 MHz.

The measurement circuit 16 is also coupled to the RF connector 12 via the coupling device 13. The measurement circuit 16 is a circuit operable to receive a resultant sweep signal comprising the incident sweep signal transmitted by the RF transmitter 14 and the reflected sweep signal reflected by either the reference impedance 17 or impedance mismatches in the transmission line 24. Furthermore, the measurement circuit 16 is operable to generate measurement signals that are representative of magnitude of the resultant sweep signal received at each segment of the sweep signal.

The reference impedance 17 includes at least one resistor or other impedance device that provides an impedance equal to the desired impedance of the transmission line 24 under test. In the exemplary embodiment, however, the reference impedance 17 includes a first impedance device 17a and a second impedance device 17b that each have an impedance level of 75 ohms which is the desired impedance of a CATV subscriber network. By including two impedance devices, the reflectometer 10 is able to maintain proper termination of the transmission line 24 under test while the reflectometer 10 internally disconnects the transmission line 24 from the RF transmitter 14 during a reference sweep. In particular, during a reference sweep the first impedance device 17a terminates the reflectometer 10 while the second impedance device 17b provides proper termination for the transmission line 24 under test.

The coupling device 13 may suitably be any device or circuitry that selectively connects the RF transmitter 14 to either the RF connector 12 or the first impedance device 17a. Furthermore, the coupling device 13 may also selectively couple the RF connector 12 to a second impedance 17b when the RF transmitter 14 is not connected to the RF connector 12. The coupling device 13 may, for example, be a relay, diode switches, GaAs FET switches, or hybrid directional RF couplers. The coupling device 13 preferably includes a control input for receiving control signals that cause the coupling device 13 to connect a either the RF connector 12 or the first impedance device 17a to the RF transmitter 14 and the measurement circuit 16.

The A/D converter 18 is coupled to the measurement circuit 16. The A/D converter 18 is a circuit that is operable to produce a digital representation of the measurement signal received from the measurement circuit 16. In particular, the A/D converter 18 generates an 8-bit value that is indicative of the DC level supplied by the measurement circuit 16.

The DSP/controller 20 is coupled to the A/D converter 18 and the memory 21. The DSP/controller 20 is operable to receive the digitized resultant signal and to determine location and severity of impedance mismatches in the transmission line 24. To this end, the DSP/controller 20 is operable to obtain the reflected sweep response signal from the digitized resultant signal and to obtain a plurality of spectral peaks from the reflected sweep response signal by performing spectral analysis upon the reflected sweep response signal. The DSP/controller 20 is further operable to adjust the spectral peaks for loss due to attenuation in the transmission line 24 and to suppress harmonics in the reflected sweep response signal.

The DSP/controller 20 is also operably connected to control the operations of the coupling device 13 and the RF transmitter 14. The DSP/controller 20 may suitably be implemented with a microprocessor, a digital signal processing circuit, analog components, digital components, or any combination thereof. The DSP/controller 20 is further connected to the keypad 25 and the display 26. The keypad 25 provides a means for accepting user input and the display 26 provides a means for communicating results to a user. Results may alternatively be communicated by an audible signal, including those generated using speech synthesis. Alternatively, results may be provided to a communication port, not shown, to facilitate the transfer of the results information to a remote device.

In particular, the DSP/controller 20 is operable to provide the RF transmitter 14 with sweep control signals that configure the RF transmitter 14 to generate a sweep signal having a certain frequency span freq_span and a certain sweep resolution swp_res. For example, the DSP/controller 20 may provide the RF transmitter 14 with sweep control signals which cause the RF transmitter 14 to sweep a RF test signal from 5 MHz to 81.8 MHz at a sweep resolution swp_res of 1024 sweep segments. In response to such control signals, the RF transmitter 14 would generate a sweep signal that first transmits a test signal at 5 MHz, then transmits a test signal at 5.075 MHz, then transmits a test signal at 5.150 MHz, and so forth, and including a last segment at 81.8 MHz.

The memory 21 is a circuit operable to store digital information. The memory 21 primarily stores algorithms and routines executed by the DSP/controller 20. Furthermore, the memory 21 stores data generated and manipulated by the DSP/controller 20.

Figure 2:
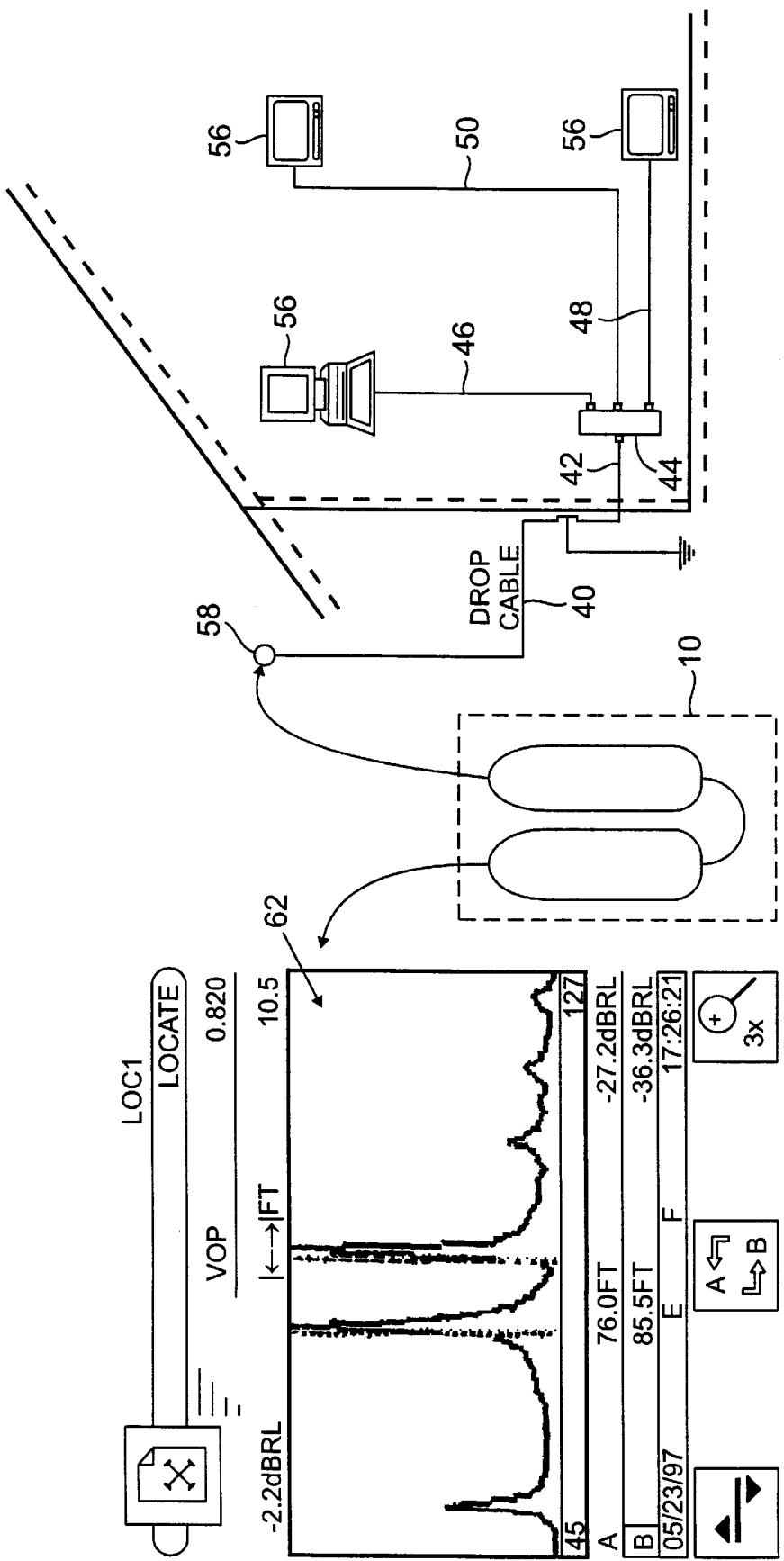
FIG. 2 shows the reflectometer of FIG. 1 coupled to a subscriber network under test.

FIG. 2 shows the frequency domain reflectometer ("reflectometer") 10 of FIG. 1 connected to a system under test. The exemplary system under test is a subscriber network, in other words, a network associated with a CATV subscriber's residence, that includes a cable drop 40, a primary cable 42, a splitter 44, a first terminal cable 46, a second terminal cable 48, and a third terminal cable 50. It shall be noted that the subscriber network of FIG. 2 is given by way of example only. The reflectometer 10 of the present invention may readily be used in subscriber networks of any configuration, as well as non-subscriber CATV networks.

The primary cable 42, which may suitably be coaxial cable, connects the drop 40 to the splitter 44. The splitter 44 is connected to provide RF signals received from the primary cable to each of the first terminal cable 46, the second terminal cable 48, and the third terminal cable 50. The first terminal cable 46, the second terminal cable 48 and the third terminal cable 50 are further connected to one of a plurality of terminal apparatus 56. The terminal apparatus 56 may include one or more television receivers, a personal computing system, or any other device receiving or transmitting information through the subscriber network. The drop 40 connects the primary cable to a tap 58 into the CATV distribution network, not shown.

In normal operation of the subscriber network, CATV signals generated by the CATV service provider propagate from the tap 58 to the drop 40. The CATV signals then propagate through the primary cable 42 to the splitter 44. The splitter 44 provides the CATV signals to each of the first terminal cable 46, the second terminal cable 48 and the third terminal cable 50. The first terminal cable 46, the second terminal cable 48, and the third terminal cable 50 provide the CATV signals to the terminal devices 56.

To test the subscriber network, the reflectometer 10 is connected to one end of the subscriber network. Specifically, the reflectometer 10 is connected via the RF connector 12 to the tap 58. It will be noted that for subsequent tests, the reflectometer 10 may be connected to either the first, second, or third terminal cables 46, 48, and 50, respectively in an attempt to pinpoint impedance mismatches within the subscriber network.

The reflectometer 10 then performs a reference sweep. To this end, the DSP/controller 20 sends a control signal to the coupling device 13 that causes the coupling device 13 to couple the first impedance device 17a to the RF transmitter 14 and to couple the second impedance device 17b to the RF connector 12. The reflectometer 10 then transmits a sweep signal such as that described above in connection with FIG. 1 which is applied to the first reference impedance 17a.

The reflectometer 10 then generates a plurality of reference measurement signals, each of which corresponds to one of the swept frequencies. To this end, the reflectometer 10 operates in the manner discussed above in connection with the measurement circuit 16 of FIG. 1. The reference measurement signals are representative of the strength of a reference sweep signal at each swept frequency. The reflectometer 10 stores each of the reference measurement signals in order to provide the reflectometer 10 with a reference sweep response signal during a test sweep.

After the reference sweep, the reflectometer 10 performs a test sweep. To this end, the reflectometer 10 transmits a test sweep signal that is substantially the same as the reference sweep signal. The test sweep signal propagates from the tap 58 to the drop 40. The test sweep signal then propagates through the primary cable 42 to the splitter 44. The splitter 44 provides the test sweep signal to each of the first terminal cable 46, the second terminal cable 48 and the third terminal cable 50. The first terminal cable 46, the second terminal cable 48, and the third terminal cable 50 provide the sweep signal to the terminal devices 56. If there are impedance mismatches in the subscriber network, then each impedance mismatch that receives the test sweep signal will cause a portion of the test sweep signal to be reflected back to the reflectometer 10.

The reflectometer 10 then generates a plurality of measurement signals, each of which corresponds to one of the swept frequencies of the test sweep signal. To this end, the reflectometer 10 operates in the manner discussed above in connection with the measurement circuit 16 of FIG. 1. The measurement signals are representative of the strength of a resultant sweep signal at each swept frequency. As stated above, the resultant sweep signal includes the test sweep signal generated by the reflectometer 10 plus any test sweep signals reflected by impedance mismatches within the subscriber network. The reflectometer 10 then obtains the reflected sweep response signal by comparing the measurement signals of the resultant sweep signal to the corresponding reference measurement signals generated during the reference sweep. The comparison of the measurement signals with the reference measurement signals yields a reflected sweep response signal of the subscriber network. The reflected sweep response signal comprises a level measurement for each segment of the sweep signal that is representative of the relationship between the measurement signals of the reference sweep signal and the measurement signals of the resultant sweep response signal.

If impedance mismatches resulting for example from damaged, poor quality, or improperly connected equipment is employed in the subscriber network, then the reflected sweep response signal will exhibit standing wave characteristics. To obtain location and severity of the impedance mismatches, the reflectometer 10 performs spectral analysis upon the reflected sweep response signal to obtain a plurality of spectral peaks which represent the frequency components of the reflected sweep response signal. Each of the spectral peaks includes a magnitude indicative of severity of a possible impedance mismatch within the subscriber network and a frequency indicative of location of the possible impedance mismatch within the subscriber network. The reflectometer 10 then adjusts the magnitudes of the spectral peaks for loss due to attenuation effects of the subscriber network. The reflectometer 10 then applies the following distance equation D to the spectral peaks in order to obtain distance to fault information:

$$D = \frac{(f_R \cdot c \cdot Vop)}{2} = (f_R \cdot 491 \cdot Vop)$$

where D is the distance in feet from the reflectometer 10 to a possible impedance mismatch within the subscriber network, $f_R$ is the frequency of a spectral peak obtained from the reflected sweep response signal, c is the speed of light in feet per a microsecond, and Vop is the velocity of propagation through the transmission lines of the subscriber network. Once the reflectometer 10 obtains the distance information, the reflectometer 10 suppresses spectral peaks that are harmonics of other spectral peaks. Finally, the reflectometer 10 displays location and severity information for each of the adjusted spectral peaks.

It should be noted that if the reflectometer 10 failed to adjust for attenuation effects, the reflectometer 10 may fail to indicate the true severity of an impedance mismatch which may result in a user determining not to repair an impedance mismatch that is actually severe enough to impair the performance of the subscriber network. Furthermore, if the reflectometer 10 failed to suppress spectral peaks that are harmonics of other spectral peaks, then the reflectometer 10 may falsely indicate an impedance mismatch within the subscriber network which in reality does not exist. As a result, the reflectometer 10 of the present invention, by providing attenuation compensation and harmonic suppression increases the accuracy of the information generated by reflectometer 10.

Figure 3:
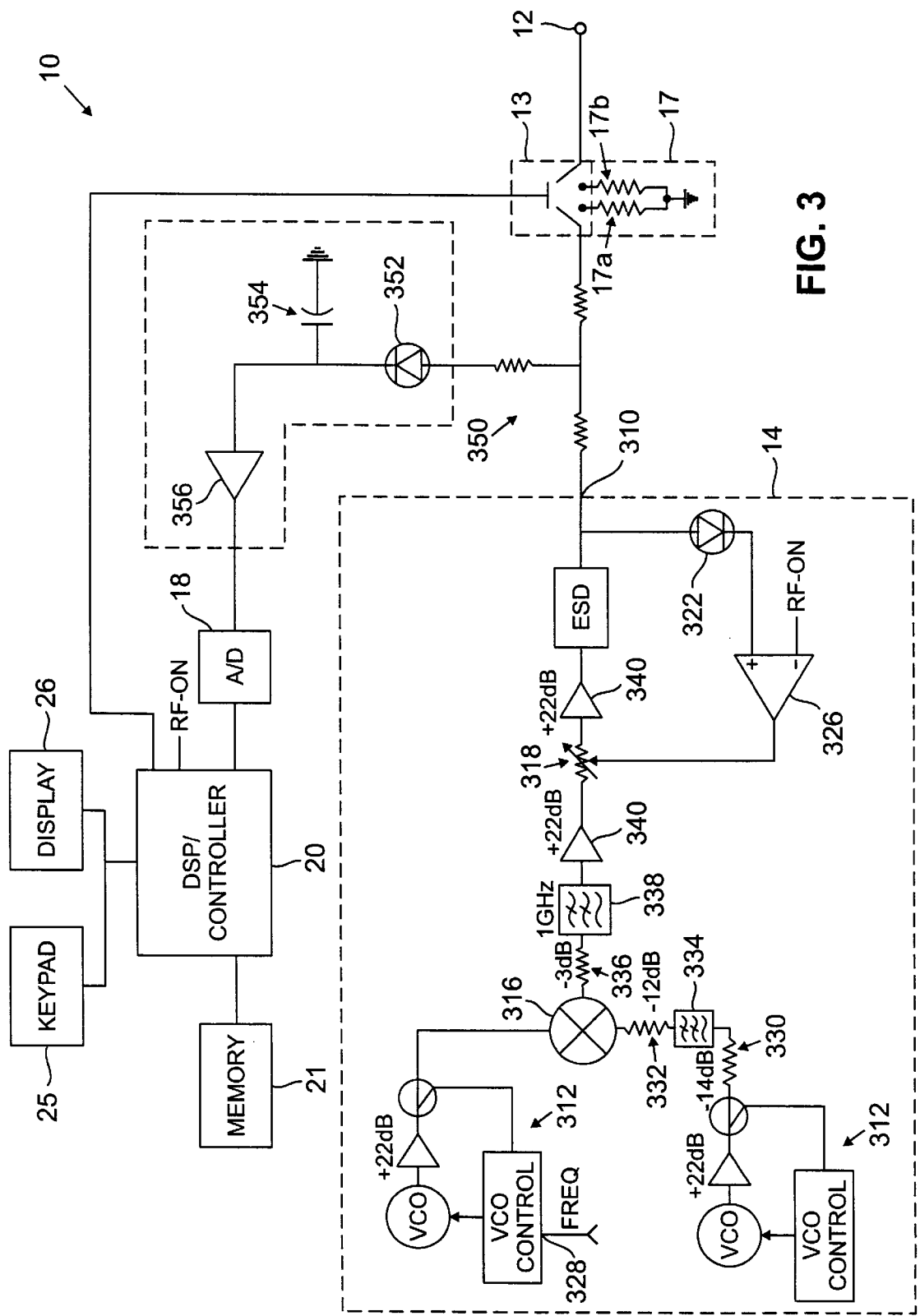
FIG. 3 shows in further detail the reflectometer of FIG. 1.

FIG. 3 shows in further detail a reflectometer 10 according to the present invention. For convenience, equivalent components in FIG. 1 are identified by the same reference numerals in FIG. 3. In general, the reflectometer 10 includes a RF connector 12, a coupling device 13, a RF transmitter 14, a measurement circuit 16, a reference impedance 17, an A/D converter 18, a DSP/controller 20, a memory 21, a keypad 25, and a display 26. The RF transmitter 14 includes a first oscillator circuit 312, a second oscillator circuit 314, a mixer 316, a variable attenuator 318, an output amplifier 320, a feedback detector 322, and an integrating amplifier 326.

The first oscillator circuit 312 is a tunable oscillator circuit operable to provide RF signals over a range of frequencies, for example, from 1655 MHz to 2450 MHz. Specifically, the first oscillator circuit 312 has a control frequency input 328 connected to the DSP/controller 20 for receiving sweep control signals therefrom. The first oscillator circuit 312 generates output RF signals having a frequency that corresponds to control signals received at the control frequency input 328. To this end, the first oscillator circuit 312 also includes a voltage controlled oscillator ("VCO") and a VCO control circuit configured in a well-known manner to produce controlled RF signals.

The second oscillator circuit 314 is an oscillator circuit operable to produce an RF signal having a fixed reference frequency. In the embodiment described herein, the second oscillator circuit 314 produces a reference frequency of 1650 MHz. The second oscillator circuit 314 may suitably have the same structure as the first oscillator circuit 312.

The mixer 316 is operably coupled to receive RF signals from the first oscillator circuit 312 and the second oscillator circuit 314 and to generate a mixed RF signal therefrom. The mixed RF signal, or output signal, may be a segment of a sweep signal. In the exemplary embodiment described herein, the mixer 316 is coupled to the second oscillator circuit 314 through first and second reference signal attenuators 330 and 332, respectively, and a low pass filter 334. The mixer 316 is coupled to provide the output signal to variable attenuator 318 through a first output signal attenuator 336, a one gigahertz low pass filter 338, and a +22 dB amplifier 340.

The variable attenuator 318 is operable to attenuate the output signal in order to provide a level-adjusted output signal to the output amplifier 320. The output amplifier 320 is preferably a +25 dB amplifier, and is further connected to provide an amplified output signal to the RF test connector 310 and the feedback detector 322. The feedback detector 322 is operable to receive the amplified output signal and generate a feedback signal having a DC level indicative of the amplified output signal magnitude. The feedback detector 322 is coupled to provide the feedback signal to the control loop amplifier 326. The control loop amplifier 326 is further coupled to the DSP/controller 20 to receive a reference signal RF_ON from the DSP/controller 20. The control loop amplifier 326 is operable to provide an error signal to the control input of the variable attenuator 318, wherein the error signal is based on the difference between the DC level of the reference signal RF_ON and the feedback signal.

The resister network 350 couples the RF circuit 14 to the coupling device 13 and the measurement circuit 16. The resistor network 350 includes three resistors each having substantially the same impedance. The resistor network 350 helps isolate the sweep signal transmitted by the RF transmitter 14 from the reflected sweep signal received from either the reference impedance 17 or the subscriber network connected to the RF connector 12. This isolation is necessary in order for the above described feedback loop of the RF transmitter 14 to properly cause the RF transmitter 14 to generate a sweep signal that has a substantially constant magnitude.

The measurement circuit 16 is operable to provide the A/D converter with a DC level that is indicative of the magnitude of the resultant sweep signal which includes the sweep signal generated by the RF transmitter 14 and the reflected sweep signal reflected by the reference impedance 17 or the subscriber network under test. The measurement circuit 16 includes a broadband detector 352, a capacitor 354, and an amplifier 356. The broadband detector 352 is operable to receive the resultant sweep signal that includes the transmitted and reflected sweep signal and generate a measurement signal having a DC level indicative of the amplified resultant sweep signal. The capacitor 354 then filters the measurement signal to remove any flutter, drift, or other AC components that may be in the measurement signal. The amplifier 356 then receives the filtered measurement signal and amplifies the measurement signal in order to provide a DC measurement signal having a suitable level for the A/D converter 18.

The A/D converter 18 then digitizes the received measurement signal. In particular, the A/D converter 18 generates an 8-bit value that is indicative of the DC level of the measurement signal and provides this generated 8-bit value to the DSP/controller 20 for processing.

Figure 4A:
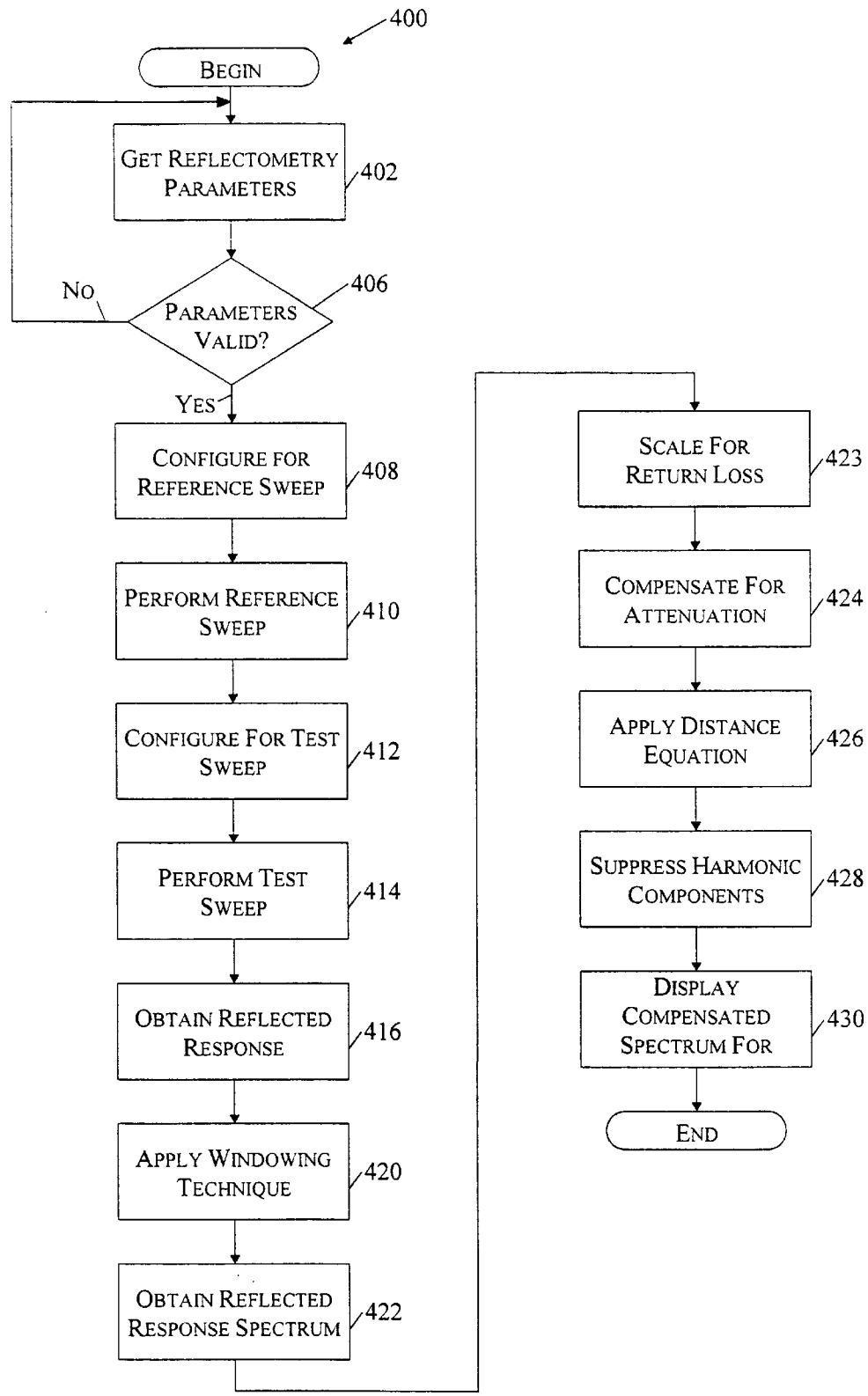
FIG. 4A shows a flowchart depicting a reflectometry procedure utilized by the reflectometer of FIG. 1.
Figure 4B:
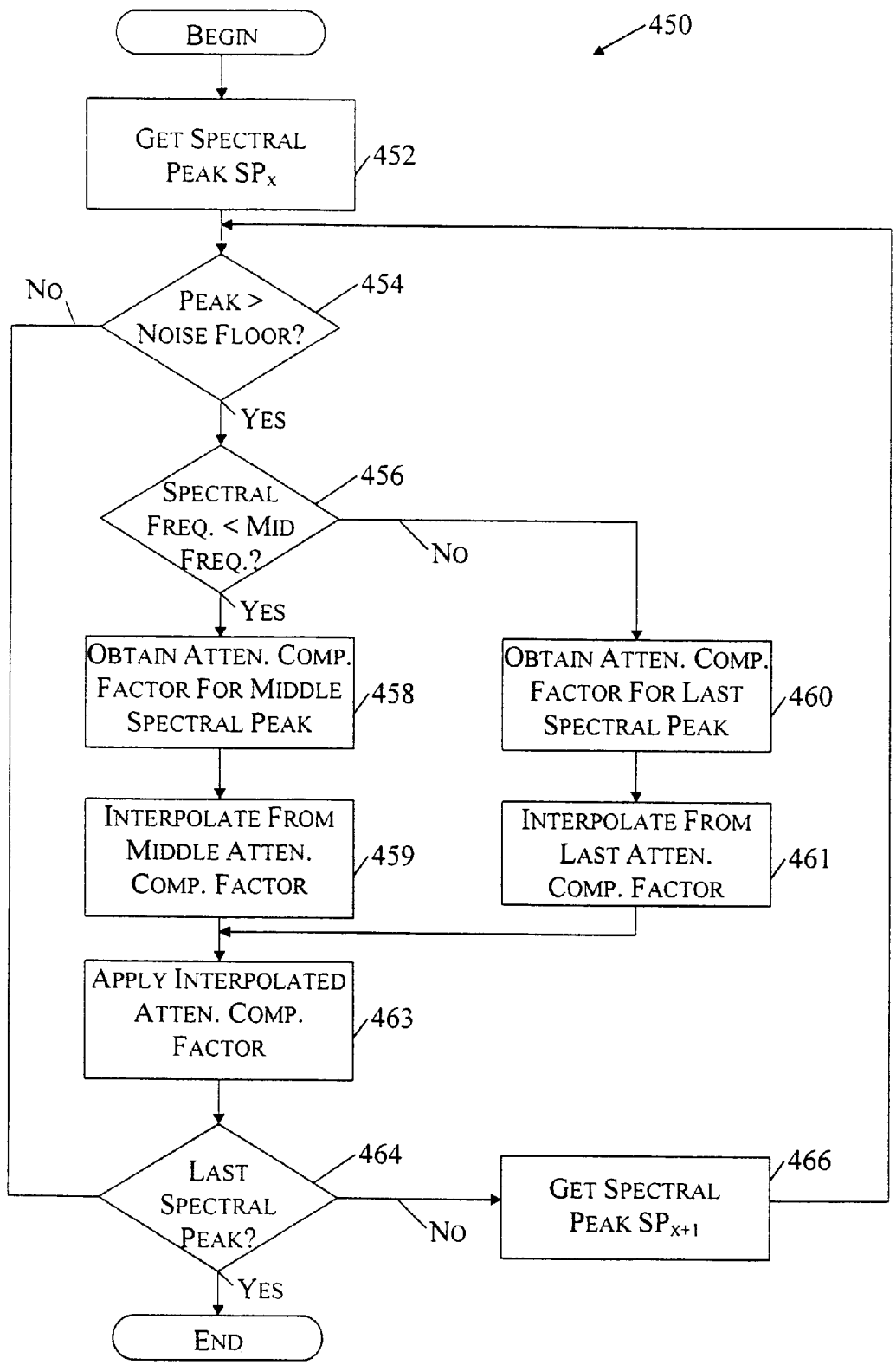
FIG. 4B shows a flowchart of an attenuation compensation procedure utilized by the reflectometer of FIG. 1.
Figure 4C:
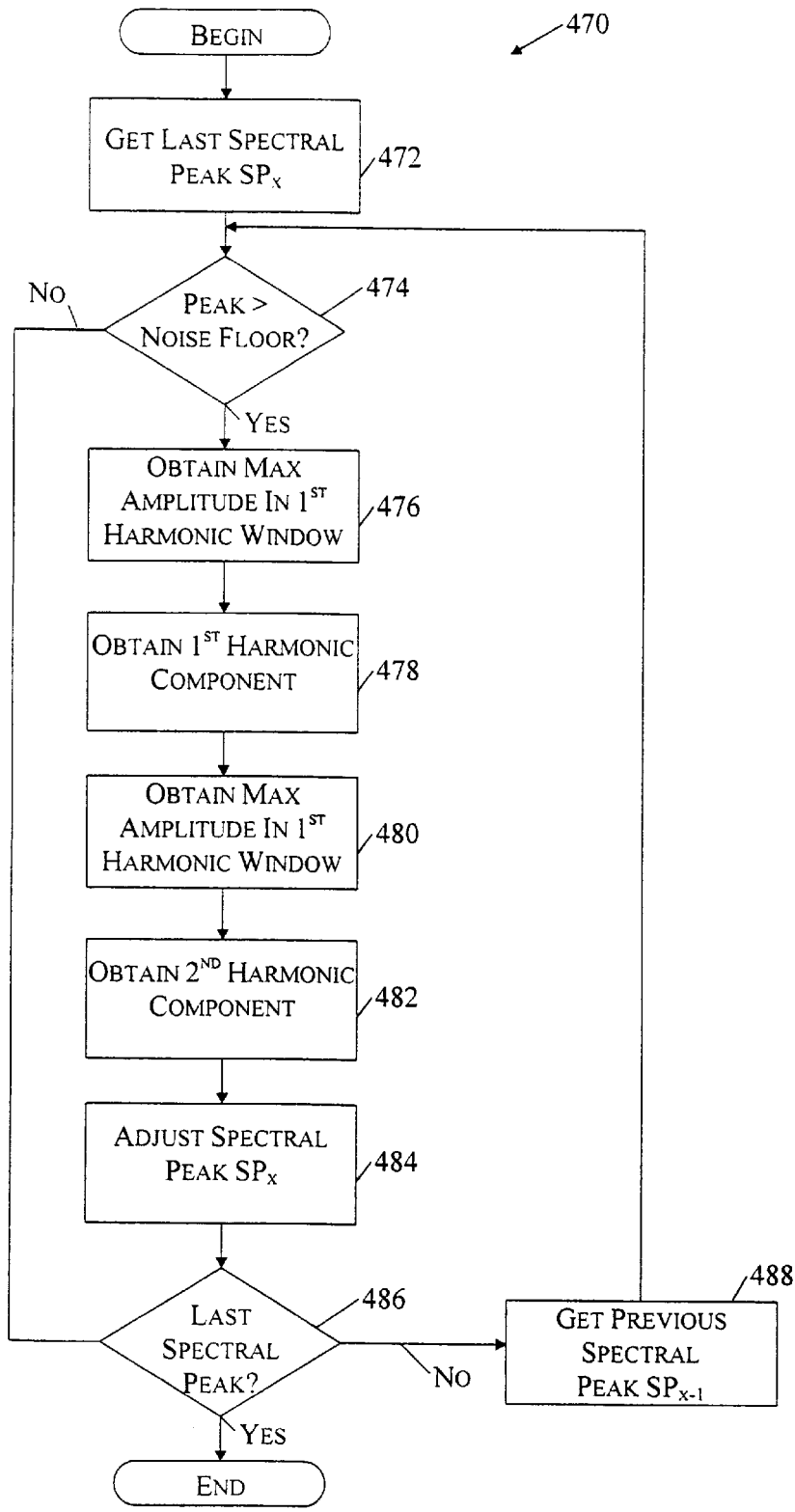
FIG. 4C shows a flowchart of a harmonic suppression procedure utilized by the reflectometer of FIG. 1.

The DSP/controller 20 is operable to receive digital values from the A/D converter 18, control the operations of the RF transmitter 14, and perform the digital signal processing functions as described herebelow with reference to FIGS. 4A, 4B, and 4C. In an exemplary embodiment, the DSP/controller 20 is implemented with a first microprocessor and a DSP engine. The first microprocessor is contained in a transmitter device that includes the coupling device 13, the RF transmitter 14, the measurement circuit 16, and the reference impedance 17. Whereas, the DSP engine is contained in a receiver device that includes the keypad 25 and the display 26. Furthermore, the DSP engine of the receiver device includes a second microprocessor, a field programmable gate array ("FPGA"), and memory. The first microprocessor of the transmitter device communicates with the DSP engine of the receiver device via a communication port and a cable not shown.

The above splitting of the reflectometer 10 into two devices fulfilled a desire for a package that may perform several types of tests upon a subscriber network. However if reflectometry measurements are the sole concern of a transmission line analyzer, then it would be preferable to implement the reflectometer in a single device having perhaps a single processor for implementing the DSP/controller 20. In any event, the DSP/controller 20 may suitably be implemented with a microprocessor, a digital signal processing circuit, analog components, digital components, or any combination thereof. Furthermore, those of ordinary skill in the art may devise other suitable DSP/controller circuitry.

In the embodiment described herein, a sweep plan is defined by a start frequency Fstart, a stop frequency Fstop, and a sweep resolution swp_res. The start frequency Fstart and the stop frequency Fstop define the lower and upper frequency limits of the sweep, while the sweep resolution swp_res defines the number of frequency points swept or segments generated between the start frequency Fstart and the stop frequency Fstop. For example, if the start frequency Fstart is equal to 5 MHz, the stop frequency Fstop is equal to 81.8 MHz, and the sweep resolution swp_res is equal to 1024, then the sweep plan is intended to take measurements at 5.000 MHz, 5.075 MHz, 5.150 MHz, 5.225 MHz, and so forth, and including 81.8 MHz. In the exemplary embodiment, the user defines the sweep resolution swp_res by selecting via the keypad 25 a predefined sweep resolution. Alternatively, the user may define the sweep resolution swp_res by directly inputting values via the keypad 25 of the reflectometer 10.

In any event, once the reflectometer 10 has the sweep plan, the DSP/controller 20 then provides a sweep control signal that corresponds to the sweep plan to the frequency control input 328 of the first oscillator circuit 312. The sweep control signal is a signal that causes the first oscillator circuit 312 to produce an RF signal having a swept frequency within some predefined range between 1655 MHz and 2450 MHz. In particular, the sweep control signal causes the first oscillator circuit 312 to generate an RF signal between the stop frequency Fstop+1650 MHz and the start frequency Fstart+1650 MHz with a frequency increment freq_inc defined by the following equation:

$$freq\_inc = \frac{(Fstop - Fstart)}{swp\_res} = \frac{freq\_span}{swp\_res}$$

The swept RF signal is then provided to the mixer 316. The second oscillator circuit 314, meanwhile, generates a fixed reference frequency RF signal having a frequency of 1650 MHz. The fixed reference frequency signal is also provided to the mixer 316 through the attenuators 330 and 332 and the low pass filter 334.

The mixer 316 receives the RF signals from each of the first and second oscillator circuits 312 and 314, respectively, and generates a sweep output signal therefrom. The sweep output signal is an RF signal having a frequency that is swept in accordance with the sweep plan, in other words, from the start frequency Fstart to the stop frequency Fstop in increments of freq_inc. The sweep output signal is then provided to the variable attenuator 318. The variable attenuator 318 provides attenuation to the sweep signal at a level that corresponds to the DC voltage appearing at its control input.

The DC voltage appearing at the control input of the variable attenuator 318 provides level control to the output sweep signal. In any event, the variable attenuator provides the level-adjusted sweep output signal to output amplifier 320. The amplifier 320 provides +25 dB of amplification to the sweep signal to produce a relatively high power sweep output signal. The high power sweep output signal propagates to the RF output 310, and is furthermore detected by the feedback detector 322.

The feedback detector 322 and the control loop amplifier 326 operate as a feedback path used to provide a high degree of control over the level of the sweep output signal. To this end, the feedback detector 322 generates a feedback signal having a DC level proportional to the amplitude or power of the sweep output signal. The control loop amplifier 326 receives the feedback signal from the feedback detector 322, and furthermore receives a reference signal RF_ON from the DSP/controller 20. The control loop amplifier 326 compares the feedback signal to the reference signal RF_ON and generates an error signal therefrom. The control loop amplifier 326 provides the error signal to the control input of the variable attenuator 318. The error signal constitutes a measure of the drift of the magnitude of the sweep output signal from the desired output level.

In particular, the desired output level in the embodiment described herein is 30 dB. The magnitude of the sweep output signal tends to drift due to, among other things, the frequency response of the various components of the RF transmitter 14. In other words, as the sweep signal frequency is swept, the various amplifiers may provide slightly varying levels of amplification and the various attenuators may provide slightly varying levels of attenuation. The feedback control loop provided by the feedback detector 322, the control loop amplifier 326 and the variable attenuator 318 ensures that a constant output level is maintained throughout the swept frequencies of the output sweep signal. It is noted that the feedback control loop may further contain temperature calibration control circuitry, the implementation of which would be known to those of ordinary skill in the art.

The resistor network 350 receives the sweep signal from the RF output 310 and provides the sweep signal to the broadband detector 352 of the measurement circuit 16 and to the coupling device 13. Furthermore, the resistor network 350 receives reflected sweep signals from the coupling device 13 and provides the received reflected sweep signals to the DC broadband detector 352. Depending on the state of the coupling device 13, the resistor network 350 receives the reflected sweep signals from either the first impedance device 17a or the subscriber network connected to the RF connector 12.

The DC broadband detector 352 generates a DC voltage that is indicative of the magnitude of the signal received from the resistor network 350. Since the resistor network 350 provides the DC broadband detector 352 with a resultant signal that includes the sweep signal and the reflected sweep signal, the DC broadband detector 352 generates a DC voltage that is indicative of the received resultant signal. The DC broadband detector 352 then provides the DC voltage to the capacitor 354. The capacitor 354 helps reduce any AC components that may exist in the DC voltage. In other words, the capacitor 354 helps to filter out any flutter, drift, or spikes that may be generated by the DC broadband detector 352. The filtered DC voltage is then provided to the amplifier 356 which generates a measurement signal that is an amplified version of the filtered DC voltage. The main purpose of the amplifier 356 is to provide the A/D converter 18 with a measurement signal that has a broad enough voltage range for the A/D converter 18 to accurately detect differences in generated measurement signals.

From a received measurement signal, the A/D converter 18 generates an 8-bit digital value that is indicative of the DC level of the received measurement signal. The A/D converter 18 then provides the digital value to the DSP/controller 20 for processing. In general, the DSP/controller 20 executes algorithms stored in the memory 21 which cause the reflectometer 10 to display severity and location of impedance mismatches in the subscriber network under test. To this end, the DSP/controller 20 obtains a reflected sweep response signal for the subscriber network. The DSP/controller 20 then obtains a reflected sweep response spectrum that includes a plurality of spectral peaks that indicates severity and location of impedance mismatches. The DSP/controller 20 adjusts the spectral peaks for loss due to attenuation in the subscriber network. Furthermore, the DSP/controller 20 suppresses spectral peaks that are harmonics of other spectral peaks. Finally, the DSP/controller 20 causes severity and location information of impedance mismatches within the subscriber network under test to be displayed on the display 26.

Further details of the operation of the reflectometer 10 and the DSP/controller 20 are discussed with reference to FIGS. 4A, 4B, and 4C. Shown in FIGS. 4A, 4B, and 4C is a detailed reflectometry procedure 400 which illustrates various features of the present invention. The reflectometry procedure 400 begins in step 402 with a user providing the reflectometer 10 with various parameters. In particular, the user of the embodiment described herein enters a velocity of propagation constant Vop for the subscriber network under test, an attenuation factor $\alpha$ for the subscriber network, and selects a sweep resolution swp_res for the detection of impedance mismatches in subscriber network. Furthermore, the user may select harmonic suppression to be applied to the reflected sweep response signal.

To this end, the user enters a first value for the velocity of propagation constant Vop for the transmission line 24 under test and a second value for attenuation factor $\alpha$ which represents the attenuation factor in dB per 100 feet of the transmission line 24 for 50 MHz signal. It should be noted that the first value for velocity of propagation constant Vop and the second value for attenuation factor $\alpha$ may be readily obtained from published characteristics of the coaxial cables which comprise the subscriber network. Furthermore, the user sets the sweep resolution swp_res by selecting between four predefined sweep resolutions swp_res. In particular, the exemplary embodiment described herein includes the following sweep resolutions: an ultra sweep resolution (swp_res=1024 sweep segments), a maximum sweep resolution (swp_res=512 sweep segments), a medium sweep resolution (swp_res=256 sweep segments), and a minimum sweep resolution (swp_res=128 sweep segments). As a result of setting the sweep resolution swp_res, the number of spectral peaks FDR_pks is also set. The spectral peaks FDR_pks are the number of spectral peaks resulting from spectral analysis of the reflected sweep response signal disregarding the spectral peaks corresponding to negative frequencies. As a result, the spectral peaks FDR_pks are equal to the number of sweep segments divided by 2. For example, spectral analysis of the reflected sweep response signal will yield 512 spectral peaks in the ultra sweep resolution mode since the ultra sweep resolution mode contains 1024 sweep segments.

The exemplary embodiment described herein also includes four predefined zoom factors that alter the sweep span of the four predefined sweep resolutions. Each zoom factor that alters the sweep span has a predefined start frequency Fstart and a predefined stop frequency Fstop for each predefined sweep resolution. As a result of selecting a sweep resolution swp_res and a zoom factor, the DSP/controller 20 may determine other parameters which characterize the reflectometry procedure 400 to be performed. For example, the DSP/controller 20 may determine a frequency span ("freq_span") in MHz and a frequency increment ("freq_inc") in MHz for the sweep signal from the following equations.

$$freq\_span = Fstop - Fstart$$

$$freq\_inc = \frac{freq\_span}{swp\_res}$$

It should be noted that a reflectometer which incorporates features of the present invention may be implemented without being limited to four sweep resolutions and four zoom factors. For example, the reflectometer 10 may be implemented such that the user enters a value for the sweep resolution swp_res, a value for a maximum distance max_dist at which to detect an impedance mismatch, and a value for the start frequency Fstart. For such information, the DSP/controller 20 may determine values for a distance resolution dist_res in feet per segment, a frequency span freq_span in MHz, a stop frequency Fstop in MHz, and frequency increment freq_inc in MHz from the following equations:

$$dist\_res = \frac{max\_dist}{FDR\_pts}$$

$$freq\_span = \frac{491 * Vop}{dist\_res}$$

$$Fstop = 5 + freq\_span$$

$$freq\_inc = \frac{freq\_span}{swp\_res}$$

The above are solely for exemplary purposes. One skilled in the art may devise other minimal sets of parameters that must be supplied by the user performing the reflectometry procedure 400.

After obtaining the above parameters, the reflectometer 10 proceeds to step 406 wherein the DSP/controller 20 performs parameter validation. In particular, the DSP/controller 20 determines whether any of the parameters are outside of acceptable ranges for the reflectometer 10. If a parameter is outside of an acceptable range, then the reflectometer 10 returns to step 402 to receive valid parameters. To this end, the DSP/controller 20 determines whether the first value for the propagation constant Vop is between 0.01 and 0.99 and the second value for the attenuation factor $\alpha$ is between 0.0 and 3.5. Furthermore, the reflectometer 10 may need to perform other parameter validations if the reflectometer 10 is not limited to predefined sweep resolutions and zoom factors. For example, the reflectometer 10 may need to determine whether a supplied maximum distance max_dist falls between a minimum value for the maximum distance and maximum distance supported by the reflectometer 10.

If the parameters are valid, then the reflectometer 10 proceeds to step 408 in order to obtain a reference sweep response signal. To this end, the DSP/controller 20 generates a control signal which causes the coupling device 13 to connect the first impedance device 17a to the RF transmitter 14 and the measurement circuit 16. Furthermore, in response to the control signal, the coupling device 13 connects the second impedance device 17b to the RF connector 12 in order to maintain proper termination of the system under test. After the reflectometer 10 is configured for a reference sweep, the reflectometer 10 performs a reference sweep upon the reference impedance 17 in step 410. In particular, the DSP/controller 20 generates control signals which cause the RF transmitter to generate a sweep signal having a first segment at the start frequency (Fstart), a second segment at the start frequency plus the frequency increment (Fstart+freq_inc), a third segment at the start frequency plus two times the frequency increment (Fstart+2*freq_inc), and so on, and including the final segment at the stop frequency (Fstop).

Figure 5:
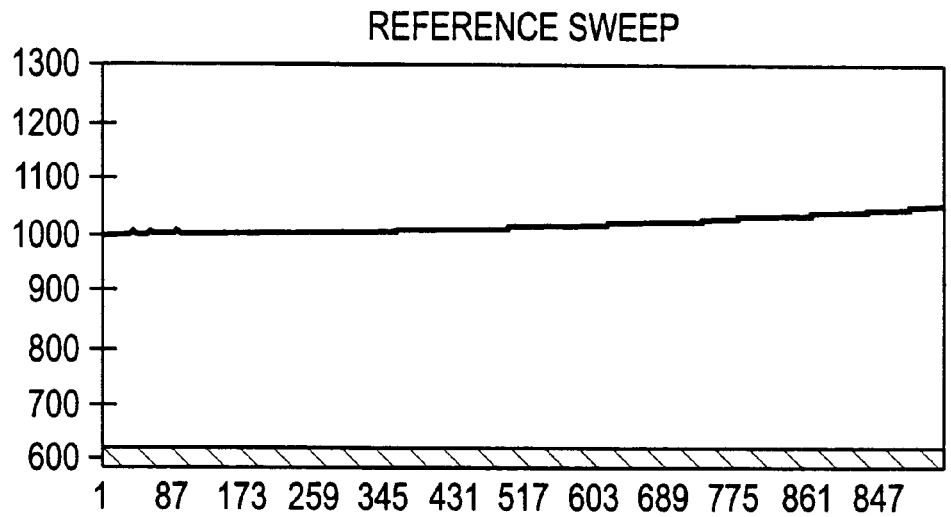
FIG. 5 shows an exemplary reference sweep response signal.

In response to generation of the reference sweep signal, the measurement circuit 16 obtains a separate reference measurement for each segment. In particular, the measurement circuit 16 generates for each segment a measurement signal having a DC level that is representative of the magnitude of the resultant sweep response signal for the segment. The measurement circuit 16 then provides each measurement signal to the A/D converter 18 for digitizing. The A/D converter 18 then digitizes each measurement signal and provides each digitized measurement signal to the DSP/controller 20 which causes each measurement signal to be stored in the memory 21 for future access. In a preferred embodiment, the measurement circuit 16 provides the A/D converter 18 with eight measurement signals for each segment of the reference sweep signal which are later averaged and stored by the DSP/controller 20. The averaging of multiple measurements at each segment of the reference sweep signal helps to reduce noise in the reference sweep response signal. An exemplary reference sweep response signal is shown in FIG. 5. As depicted, the reference sweep response signal tends to have a slight upward slope due to the hardware which implements the measurement circuit 16.

After the reference sweep response has been obtained, the reflectometer 10 is configured in step 412 for a test sweep. To this end, the DSP/controller 20 generates a control signal which causes the coupling device 13 to couple the system under test to the RF transmitter 14 and the measurement circuit 16. After the reflectometer 10 is configured for a test sweep, the reflectometer 10 performs in step 414 a test sweep upon the subscriber network under test. To this end, the DSP/controller 20 generates control signals which cause the RF transmitter to generate a test sweep signal having the same characteristics as the reference sweep signal of step 410. In particular, the DSP/controller 20 generates control signals which cause the RF transmitter to generate a test sweep signal having a first segment at the start frequency (Fstart), a second segment at the start frequency plus the frequency increment (Fstart+freq_inc), a third segment at the start frequency plus two times the frequency increment (Fstart+2*freq_inc), and so on until the final segment at the stop frequency (Fstop).

Figure 6:
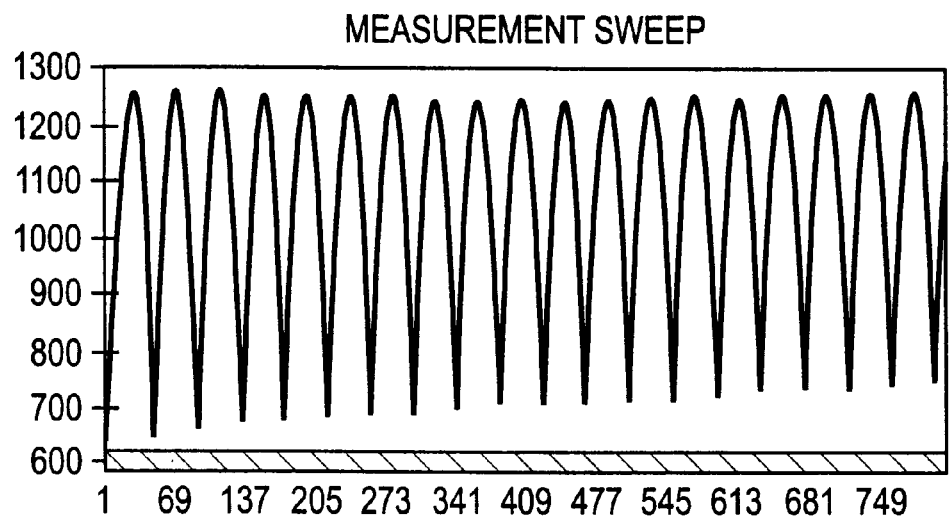
FIG. 6 shows an exemplary resultant sweep response signal.

The measurement circuit 16 in response to generation of the test sweep signal obtains a separate test measurement for each segment. In particular, the measurement circuit 16 generates for each segment a measurement signal having a DC level that is representative of the magnitude of the resultant sweep signal for the segment. The resultant sweep signal includes the incident test sweep signal transmitted by the RF transmitter 14 plus any reflected test sweep signal reflected by the subscriber network under test. The measurement circuit 16 then provides each measurement signal to the A/D converter 18 for digitizing. The A/D converter 18 then digitizes each measurement signal and provides the each digitized measurement signal to the DSP/controller 20 which causes each measurement signal to be stored in the memory 21 for future access. In a preferred embodiment, the measurement circuit 16 provides the A/D converter 18 with eight measurement signals for each segment of the test sweep signal which are averaged and stored by the DSP/controller 20. The averaging of multiple measurements at each segment of the resultant sweep response signal helps to reduce noise in the resultant sweep response signal. An exemplary resultant sweep response signal that includes the incident and reflected test sweep signal is shown in FIG. 6 for an unterminated 27 foot cable.

Figure 7:
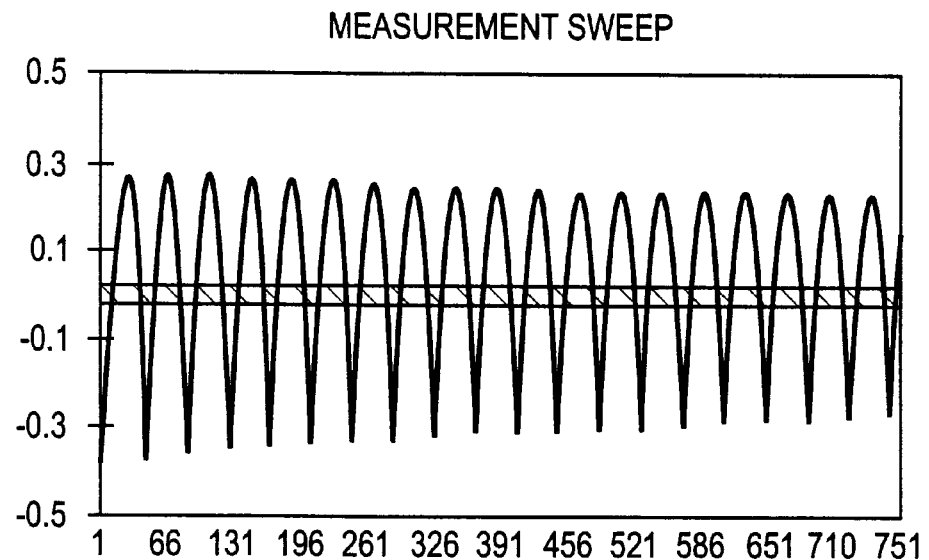
FIG. 7 shows an exemplary reflected sweep response signal.

After the test sweep response signal is obtained, the reflectometer 10 extracts the reflected sweep response signal from the resultant sweep response signal. To this end, the DSP/controller 20 divides the measurement signal for each segment of the test sweep response signal by the measurement signal for the corresponding segment of the reference sweep response signal. Furthermore, from this resulting signal the DSP/controller 20 subtracts the value of 1 from each point of the resulting signal in order to obtain the difference between the resultant sweep response signal and the reference sweep response signal. In sum, the extraction of the reflected sweep response signal may be represented by the following equation:

$$C_x = \frac{B_x}{A_x} - 1 \quad \text{for } x = 1 \text{ to } swp\_res$$

where $A_x$ is the measurement level of the $x^{th}$ segment of the reference sweep response signal, $B_x$ is the measurement level of the $x^{th}$ segment of the test sweep response signal, and $C_x$ is the level of the $x^{th}$ segment of the reflected sweep response signal. FIG. 7 shows a reflected sweep response signal for an unterminated 27 foot transmission line. Since each point of the reflected sweep response signal is representative of the response of the transmission line to a test signal having a certain frequency, the reflected sweep response signal is essentially a frequency response of the transmission line under test.

After the reflectometer 10 obtains the reflected sweep response signal, the reflectometer 10 performs spectral analysis upon the reflected sweep response signal in order to obtain a reflected sweep response spectrum that includes a plurality of spectral peaks FDR_pks which represent the frequency components of the reflected sweep response signal. In particular, the DSP/controller 20 applies in step 420 a windowing technique (e.g. a Hamming window) to the reflected sweep response signal and performs in step 422 a Fast Fourier Transform ("FFT") upon the results of the windowing technique. The effect of the windowing technique is to yield a cleaner spectrum when the FFT is applied to the reflected sweep response signal. FFT techniques and windowing techniques are well known to those of ordinary skill in the art.

Figure 8:
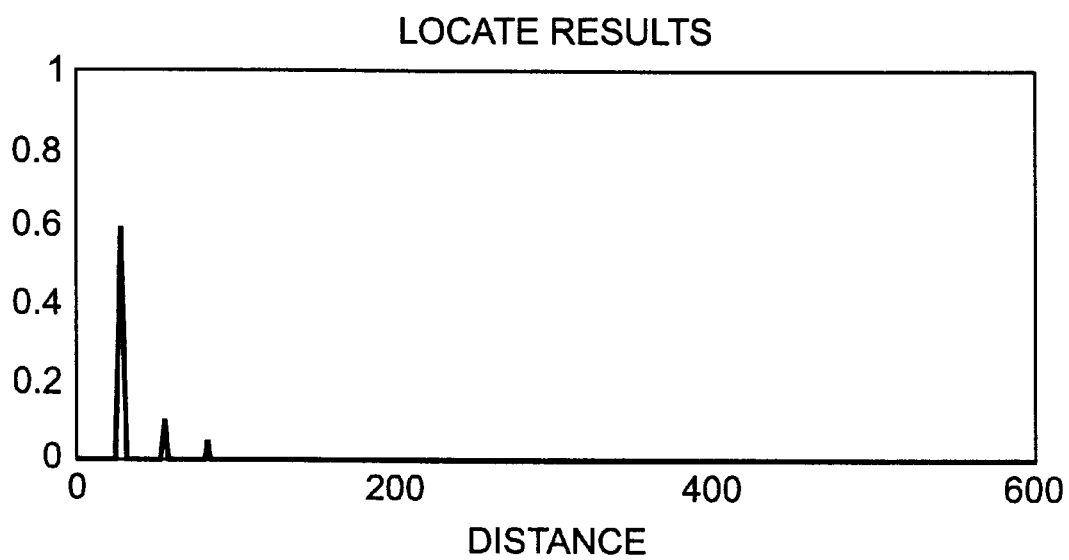
FIG. 8 shows a simplified exemplary reflected sweep response spectrum.

The FFT yields a reflected sweep response spectrum having a plurality of spectral peaks FDR_pks in which each spectral peak includes a magnitude and a frequency. The magnitude of a spectral peak indicates severity of a possible impedance mismatch within the subscriber network. Furthermore, the frequency of the spectral peak indicates location of a possible impedance mismatch within the subscriber network. It should be noted that the FFT of the reflected sweep response signal will generate spectral peaks having both positive and negative frequencies. The DSP/controller 20 in the exemplary embodiment described herein discards each spectral peak that has a negative frequency thereby reducing the number of points in the spectrum by half. For example, in the ultra sweep resolution mode, the test sweep signal has 1024 segments that generates a reflected sweep response signal having 1024 points. However, when the FFT is applied to the reflected sweep response signal, the FFT generates a reflected sweep response segment having 512 spectral peaks ranging from a first spectral peak $FDR\_pk_1$ to a last spectral peak $FDR\_pk_{512}$. An exemplary reflected sweep response spectrum 62 is shown in FIG. 1, and a simplified exemplary reflected sweep response spectrum is shown in FIG. 8 for an unterminated 27 foot transmission line. It should be noted that the reflected sweep response spectrum is essentially the frequency components of the frequency response of the transmission line under test.

The DSP/controller 20 then scales each point of the reflected sweep response signal in order to (i) compensate for any attenuation or gain the reflectometer 10 has introduced into the signal measurement and (ii) relate the reflected sweep response signal to the magnitude of return loss due to an impedance mismatch in the subscriber network reflecting back the test sweep signal. In particular, the magnitude of return loss in dB may be represented by the following equation:

$$|Return\_Loss| = 20 \cdot \log(Rpp)$$

where Rpp is the peak to peak value of the reflected sweep response signal. As a result of the above, the DSP/controller 20 multiplies each point of the reflected sweep response signal by a circuit compensation factor ckt_comp in order to compensate for the reflectometer 10 and by 20 in order to relate the reflected sweep response signal to the magnitude of return loss.

The reflectometer 10 then proceeds to step 424 wherein the DSP/controller 20 adjusts the obtained spectrum for effects due to attenuation in the subscriber network. In general, the DSP/controller 20 determines a separate attenuation compensation factor for each spectral peak of the spectrum and multiplies the magnitude of each spectral peak by its corresponding correction factor in order to obtain a reflected sweep response spectrum that has been compensated for attenuation. FIG. 4B illustrates an attenuation compensation procedure 450 which incorporates various features of the present invention therein.

In order to better appreciate the attenuation compensation procedure 450 of the present invention, a detailed explanation of attenuation effects follows. The attenuation factor α for a transmission line determines the amount of energy dissipated in the transmission line. The primary cause of attenuation is due to conductor losses associated with radio frequencies. These conductor losses are a function of distance traveled through the conductor and of skin depth and hence vary with the square root of frequency. The attenuation factor α for a transmission line may be represented by the following equations:

$$\alpha = -\sigma \cdot \frac{d}{100} \cdot \sqrt{freq} \quad (dB)$$

$$\alpha = 10^{-\frac{\sigma}{20} \cdot \frac{d}{100} \cdot \sqrt{freq}} \quad (linear)$$

where σ equals the conductance loss of the transmission line, d equals distance traveled through the transmission line, and freq equals frequency of the RF signal traveling through the transmission line.

Ideally, a single impedance mismatch within the subscriber network will reflect a single sinusoid at a given frequency. However, attenuation in the subscriber network will have a dampening effect on the magnitude of the reflected sinusoid. This dampening effect may be represented by a single sinusoid multiplied by the attenuation factor α. Therefore, a reflected sweep segment as a function of the frequency freq of a single sweep segment may be depicted by the following equation:

$$\text{Reflected Segment}(freq) = a \cdot A \cdot \cos\left(2 \cdot \pi \cdot freq \cdot \left(\frac{dist}{Vop \cdot 491}\right)\right)$$

where α equals attenuation factor for a transmission line at the frequency freq, A equals the amplitude of the reflected sweep signal, freq equals the frequency of the reflected sweep signal, dist equals the distance of the impedance mismatch from the reflectometer 10, Vop equals the velocity of propagation for the transmission line, and 491 is ½ the speed of light in feet per a microsecond. Substituting t for freq, f1 for (dist/(Vop*491)), and c for the constant 491, the above equation may be rewritten as follows:

$$\text{Reflected Segment}(t) = a \cdot A \cdot \cos(2 \cdot \pi \cdot f1 \cdot t) = \left[10^{-f1 \cdot c \cdot \sqrt{t}}\right] \cdot A \cdot \cos(2 \cdot \pi \cdot f1 \cdot t)$$

$$= f(B) \cdot f(C)$$

The ideal response without attenuation would be the FFT of a cosine which is an impulse (dirac) function with an amplitude of ½A at a frequency equal to f1. The FFT of two functions multiplied together in the time domain is equal to the FFT of the first function convoluted with the FFT of the second function. Therefore the above function can be rewritten as follows:

$$FFT(\text{Reflected Segment}(t)) = FFT(f(B)) * FFT(f(C))$$

$$= FFT\left(10^{-f1 \cdot c \cdot \sqrt{t}}\right) * FFT(A \cdot \cos(2 \cdot \pi \cdot f1 \cdot t))$$

$$= FFT\left(10^{-f1 \cdot c \cdot \sqrt{t}}\right) * \left(\frac{A}{2} \cdot \delta(f1)\right)$$

Convolution with the impulse function δ(f1) shifts the FFT of the attenuation factor to the frequency f1. Therefore, the FFT of the reflected segment may be represented by the following equation:

$$FFT(\text{Reflected Segment}(t)) = \frac{A}{2} \cdot FFT_{f=f1}\left(10^{-f1 \cdot c \cdot \sqrt{t}}\right)$$

Figure 10:
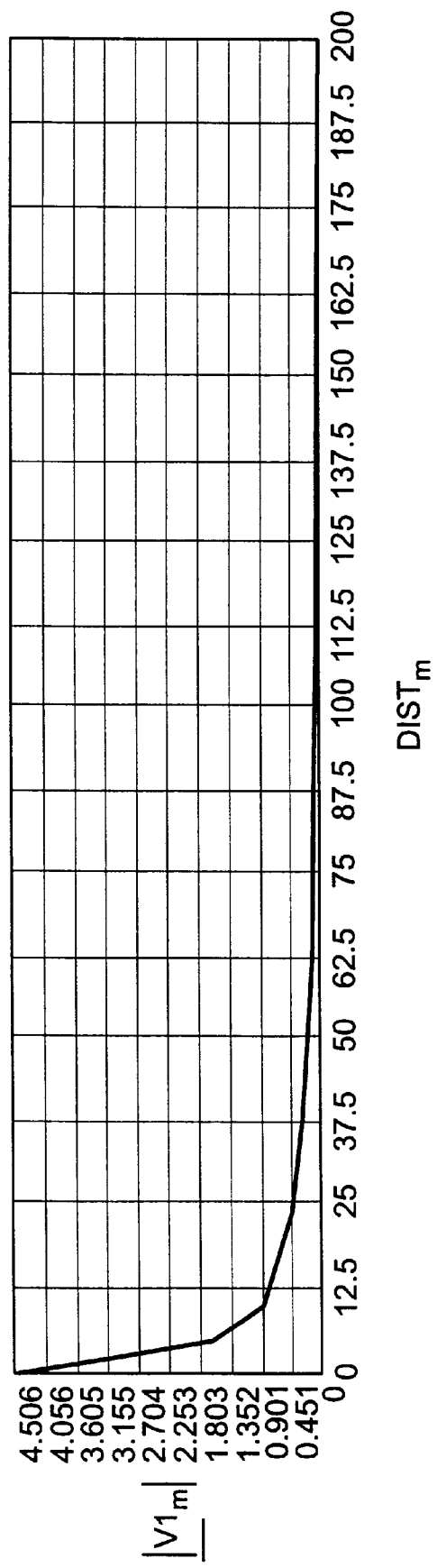
FIG. 10 shows a spectrum for an attenuation factor equation.

As can be seen from the above equation, the FFT of the attenuation factor determines the effect of attenuation on one particular spectral peak $FDR\_pk_x$ of the reflected sweep response spectrum. The FFT of the attenuation factor, however, does not have a closed form but can be solved point to point and is graphically shown in FIG. 10. FIG. 10 illustrates that the major effect of the attenuation factor is centered at 0 on the X-axis (i.e. the DC component) and decays quite rapidly. The rate of decay determines the effects on other spectral peaks near the one particular spectral peak $FDR\_pk_x$. If the magnitude of the spectral peak is sufficiently large, then the spectral peak may be approximated by an impulse at DC without concern for the spreading effects. The rate of decay is determined by the attenuation factor for the transmission line. For large values of attenuation, the graph of the FFT of the attenuation factor will be wider and effect other spectral peaks. These effects on other spectral peaks will not add appreciable error in a CATV system since cable attenuation must be within a reasonable range in order for the CATV system to function properly.

The amplitude of the above impulse at DC is the inverse of the attenuation compensation factor $\alpha\_comp_x$ that needs to be applied to the magnitude of the spectral peak $FDR\_pk_x$. The amplitude of the above impulse at DC is the simple average of the attenuation for the distance dist across the frequency span freq_span which is expressed by the following equation:

$$DC(dist) = \sum \alpha(dist, freq) = \frac{1}{freq\_span} \sum_{f=Fstart}^{Fstop} 10^{-\frac{\sigma}{20} \cdot \frac{d}{100} \cdot \sqrt{f}}$$

where f is incremented between the start frequency Fstart and the stop frequency Fstop of the test sweep by the frequency increment freq_inc of the test sweep. Taking the inverse of the above DC equation and substituting the above distance equation D into the above DC equation, the attenuation compensation factor $\alpha\_comp_x$ for a spectral peak $FDR\_pk_x$ having a spectral frequency $f_{R_x}$, is defined by the following equation:

$$\alpha\_comp_x(f_{R_x}) = \left(\frac{1}{freq\_span} \sum_{f=Fstart}^{Fstop} 10^{-\frac{\sigma}{20} \cdot \frac{(f_{R_x} \cdot 491 \cdot Vop)}{100} \cdot \sqrt{f}}\right)^{-1}$$

where f is incremented between the start frequency Fstart of the test sweep and the stop frequency Fstop of the test sweep by the frequency increment freq_inc of the test sweep.

The DSP/controller 20 could determine the conductance loss σ for the subscriber network from the attenuation factor α supplied by the user in step 402. Then, the DSP/controller 20 could calculate from the above attenuation compensation factor equation an appropriate attenuation compensation factor for each spectral peak of the reflected sweep response spectrum. In particular, since the user supplied the attenuation factor α for the subscriber network in dB per 100 ft for a signal having a frequency of 50 MHz, the DSP/controller 20 may apply the supplied attenuation factor α to the following equation to obtain the conductance loss σ for subscriber network.

$$\sigma = \alpha \cdot \frac{100}{d} \cdot \frac{1}{\sqrt{freq}} = \alpha \cdot \frac{100}{100} \cdot \frac{1}{\sqrt{50}} = 0.1414 \cdot \alpha$$

Then, the DSP/controller 20 may determine an attenuation compensation factor $\alpha\_comp_x$ for each spectral peak FDR__pk$_x$ of the reflected sweep response spectrum by calculating the attenuation compensation factor $\alpha\_comp_x$ from the above attenuation compensation factor equation $\alpha\_comp_x(f_R)$. It should be noted that this approach is computationally intensive, especially in the ultra mode where the DSP/controller 20 may need to calculate a separate attenuation compensation factor $\alpha\_comp_x$ for each of the 512 spectral peaks of the reflected sweep response spectrum.

Therefore, in order to reduce the computation burden of the DSP/controller 20, the reflectometer 10 of the exemplary embodiment takes advantage of the fact that the logarithm of the attenuation compensation factor equation $\alpha\_comp_x(f_R)$ exhibits piece-wise linear characteristics. As a result of these piece-wise linear characteristics, the DSP/controller 20 may linearly interpolate attenuation compensation factors $\alpha\_comp$ from a few provided or calculated attenuation compensation factors. In particular, since the exemplary embodiment supports a limited number of predefined sweep resolutions and zoom factors, the reflectometer 10 stores a table of attenuation compensation factors from which to interpolate additional attenuation compensation factors.

As can be seen from the above attenuation compensation factor equation, the attenuation compensation factor equation is dependent on the sweep resolution, the zoom factor, and the velocity of propagation constant Vop times the conductance loss $\sigma$. As a result of these dependency, separate attenuation compensation factors must be stored for each sweep resolution, zoom factor, and velocity of propagation constant Vop times conductance loss $\sigma$ values supported by the reflectometer 10. It has been determined that the reflectometer 10 of the exemplary embodiment may obtain a desired level of accuracy by supplying an attenuation compensation table of attenuation compensation factors that takes into account 101 different velocity of propagation constant Vop times conductance loss $\sigma$ values that range between and include the values 0.0 and 0.5.

For example, in the exemplary embodiment, the reflectometer 10 supports 16 sweep modes made up of 4 sweep resolutions that each have 4 zoom factors that alter the start frequency Fstart and the stop frequency Fstop of the test sweep signal. Accordingly, for each of the 16 sweep modes, the attenuation compensation table includes 101 middle attenuation compensation factors $\alpha\_comp_{mid}$ and 101 end attenuation compensation factors $\alpha\_comp_{end}$. Each of the 101 attenuation compensation factor pairs corresponds to a different velocity of propagation constant Vop times conductance loss $\sigma$ value. In particular, each end compensation factor $\alpha\_comp_{end}$ corresponds to a maximum spectral frequency $f_{R_{max}}$ obtainable for the sweep mode with its respective velocity of propagation constant Vop times conductance loss $\sigma$ value. Similarly, each middle compensation factor $\alpha\_comp_{mid}$ corresponds to a middle spectral frequency $f_{R_{mid}}$ that is half of the maximum spectral frequency $f_{R_{max}}$ obtainable for the sweep mode with its respective velocity of propagation constant Vop times conductance loss $\sigma$ value. Furthermore, in the exemplary embodiment, each attenuation compensation factor is a two byte value. Accordingly, the attenuation compensation table of the exemplary embodiment contains 6,464 bytes (16 modes*101 pairs/mode*4 bytes/pair) of attenuation compensation factors.

Now referring back to FIG. 4B, the attenuation compensation procedure 450 will be described in detail. In order to simplify the following description, it is assumed that the FFT in step 416 produced 512 spectral peaks ranging from a first spectral peak FDR__pk$_1$ to a last spectral peak FDR__pk$_{512}$. The attenuation compensation procedure 450 begins in step 452 with the DSP/controller 20 obtaining the first spectral peak FDR__pk$_1$ of the reflected sweep response spectrum. The DSP/controller 20 then determines in step 454 whether the magnitude of the selected spectral peak FDR__pk$_x$ is greater than a noise floor level for the reflectometer 10. If the magnitude of the selected spectral peak FDR__pk$_x$ is not greater than the noise floor level, the DSP/controller 20 proceeds to step 464 in order to determine whether the last spectral peak FDR__pk$_{512}$ has been processed. If the DSP/controller 20 determines that the last spectral peak FDR__pk$_{512}$ has not been processed then the DSP/controller 20 proceeds to step 466 to obtain the next spectral peak FDR__pk$_{x+1}$ for processing.

If the magnitude of the selected spectral peak FDR__pk$_x$ is greater than the noise floor level, then the DSP/controller 20 proceeds to step 456. In step 456, the DSP/controller 20 determines whether the frequency $f_{R_x}$ of the selected spectral peak FDR__pk$_x$ is less than or equal to the middle spectral frequency $f_{R_{mid}}$ for the test sweep. If the frequency $f_{R_x}$ is less than or equal to the middle spectral frequency $f_{R_{mid}}$ for the test sweep, then the DSP/controller 20 proceeds to step 458; otherwise the DSP/controller 20 proceeds to step 460. In step 458, the DSP/controller 20 obtains the middle attenuation compensation factor $\alpha\_comp_{mid}$ for the test sweep from the attenuation compensation table. In particular, the DSP/controller 20 obtains the middle attenuation compensation factor $\alpha\_comp_{mid}$ that corresponds to (i) the sweep resolution and the zoom factor of the test sweep and (ii) that most closely matches the velocity of propagation Vop times the conductance loss $\sigma$ value for the subscriber network supplied by the user in step 402. The DSP/controller 20 then in step 459 determines the attenuation compensation factor $\alpha\_comp_x$ for the selected spectral peak FDR__pk$_x$ from the obtained middle attenuation compensation factor $\alpha\_comp_{mid}$. In particular, the DSP/controller 20 applies the middle attenuation compensation factor $\alpha\_comp_{mid}$ to the following equation in order to obtain the attenuation compensation factor $\alpha\_comp_x$ for the selected spectral peak FDR__pk$_x$.

$$\alpha\_comp_x = \frac{\alpha\_comp_{mid}}{1/2 \cdot \max\_dist} \cdot dist_x$$

where max__dist equals the maximum distance for the sweep mode, and dist$_x$ equals the distance corresponding to FDR__pk$_x$. It should be noted the ½ max__dist is equal to the distance associated with the middle attenuation compensation factor $\alpha\_comp_{mid}$.

In step 460 the DSP/controller 20 obtains from the attenuation compensation table the middle attenuation compensation factor $\alpha\_comp_{mid}$ and the end attenuation compensation factor $\alpha\_comp_{end}$ for the test sweep. The DSP/controller 20 then in step 461 determines the attenuation compensation factor $\alpha\_comp_x$ for the selected spectral peak FDR__pk$_x$ from the obtained middle attenuation compensation factor $\alpha\_comp_{mid}$ and the obtained end attenuation compensation factor $\alpha\_comp_{end}$. In particular, the DSP/controller 20 applies the obtained middle attenuation compensation factor $\alpha\_comp_{mid}$ and the obtained end attenuation compensation factor $\alpha\_comp_{end}$ to the following equation in order to obtain the attenuation compensation factor $\alpha\_comp_x$ for the selected spectral peak FDR__pk$_x$.

$$\alpha\_comp_x = \frac{\alpha\_comp_{end} - \alpha\_comp_{mid}}{1/2 \cdot max\_dist} \cdot (dist_x - max\_dist) + \alpha\_comp_{end}$$

where max_dist equals the maximum distance for the sweep resolution mode, and $dist_x$ equals the distance corresponding to FDR_$pk_x$. It should be noted the ½ max_dist is equal to the distance associated with the middle attenuation compensation factor $\alpha\_comp_{mid}$.

In either event, the DSP/controller 20 adjusts in step 463 the magnitude of the selected spectral peak FDR_$pk_x$. In particular, the DSP/controller 20 multiplies the magnitude of the selected spectral peak FDR_$pk_x$ by the obtained attenuation compensation factor $\alpha\_comp_x$ for the selected spectral peak FDR_$pk_x$ in order to obtain an adjusted magnitude for the selected spectral peak FDR_$pk_x$. Once the DSP/controller 20 has adjusted the magnitude of the selected spectral peak FDR_$pk_x$, the DSP/controller 20 proceeds to step 464. In step 464, the DSP/controller 20 determines whether the last spectral peak FDR_$pk_{512}$ has been processed. If the last spectral peak FDR_$pk_{512}$ has been processed, then the DSP/controller 20 finishes the attenuation compensation procedure 450 by proceeding to step 426 of the reflectometry procedure 400 shown in FIG. 4A. However, if the last spectral peak FDR_$pk_{512}$ has not been processed, then the DSP/controller 20 proceeds to step 466. In step 466, the DSP/controller 20 selects the next spectral peak FDR_$pk_{x+1}$ for processing. For example, if the DSP/controller 20 was processing the $20^{th}$ spectral peak FDR_$pk_{20}$, then the DSP/controller 20 selects the $21^{st}$ spectral peak FDR_$pk_{21}$ as the next spectral peak. After selecting the next spectral peak the DSP/controller 20 returns to step 454 in order to process the selected spectral peak.

After the reflectometer 10 compensates the spectral peaks of the reflected sweep response signal for attenuation effects, the reflectometer 10 performs a distance calculation for each spectral peak. To this end, the DSP circuit 10 determines a distance dist for each spectral peak FDR_$pk_x$ of the reflected sweep response spectrum from the above distance equation which for convenience is also presented below:

$$D = \frac{(f_R \cdot c \cdot Vop)}{2} = f_R \cdot 491 \cdot Vop$$

where $f_R$ equals the frequency of a spectral peak of the reflected sweep response spectrum, c is the speed of light in feet per microsecond, and Vop is the velocity of propagation which the user supplied in step 402.

The reflectometer 10 then in step 428 suppresses the spectral peaks that are harmonics of other spectral peaks. In general, the DSP/controller 20 determines whether a first spectral peak has a predetermined relationship to a second spectral peak that is indicative of the first spectral peak being a harmonic of the second spectral peak. If the DSP/controller 20 determines the first spectral peak has the predetermined relationship then the DSP/controller 20 subtracts a percentage of the magnitude of the second spectral peak from the magnitude of the first spectral peak.

To this end, the DSP/controller 20 obtains a first maximum magnitude from a first group of spectral peaks that fall within a first harmonic window of a first spectral peak. The DSP/controller 20 then multiplies the obtained first maximum magnitude by a first harmonic factor in order to obtain a first harmonic value that is indicative of a first harmonic component contained in the first spectral peak. Then, the DSP/controller 20 obtains a second maximum magnitude from a second group of spectral peaks that fall within a second harmonic window of the first spectral peak. The DSP/controller 20 then multiplies the obtained second maximum magnitude by a second harmonic factor in order to obtain a second harmonic value that is indicative of the second harmonic component contained in the first spectral peak. Finally, the DSP/controller 20 subtracts the greater of the first harmonic value and the second harmonic value from the first spectral peak in order to remove the respective harmonic component from the first spectral peak.

A detailed harmonic suppression procedure 470 which incorporates various features of the present invention therein is illustrated in FIG. 4C. In order to better appreciate the harmonic suppression procedure 470 of the present invention, a detailed explanation of harmonics follows.

The equation for a wave on a transmission line is as follows:

$$E_G = E_R \cdot \cosh(\sqrt{Z \cdot Y} - L) + I_R \cdot Z_0 \cdot \sinh(\sqrt{Z \cdot Y} - L)$$

where $Z_0$ equals the characteristic impedance $\sqrt{Z/Y}$; $\sqrt{Z \cdot Y}$ equals the propagation constant $\alpha + j \cdot \beta$; $E_G$ equals the voltage at the generator of the wave, $E_R$ equals the voltage at the load, $I_R$ equals the current at the load, and L equals the length of the transmission line. As can be seen from the above equation, the general response of a wave on a transmission line over distance contains hyperbolic functions cosh() and sinh(). As a result of the hyperbolics, the response contains harmonics that depend primarily on the severity of the impedance mismatch, the attenuation constant, and the distance to fault.

Figure 9:
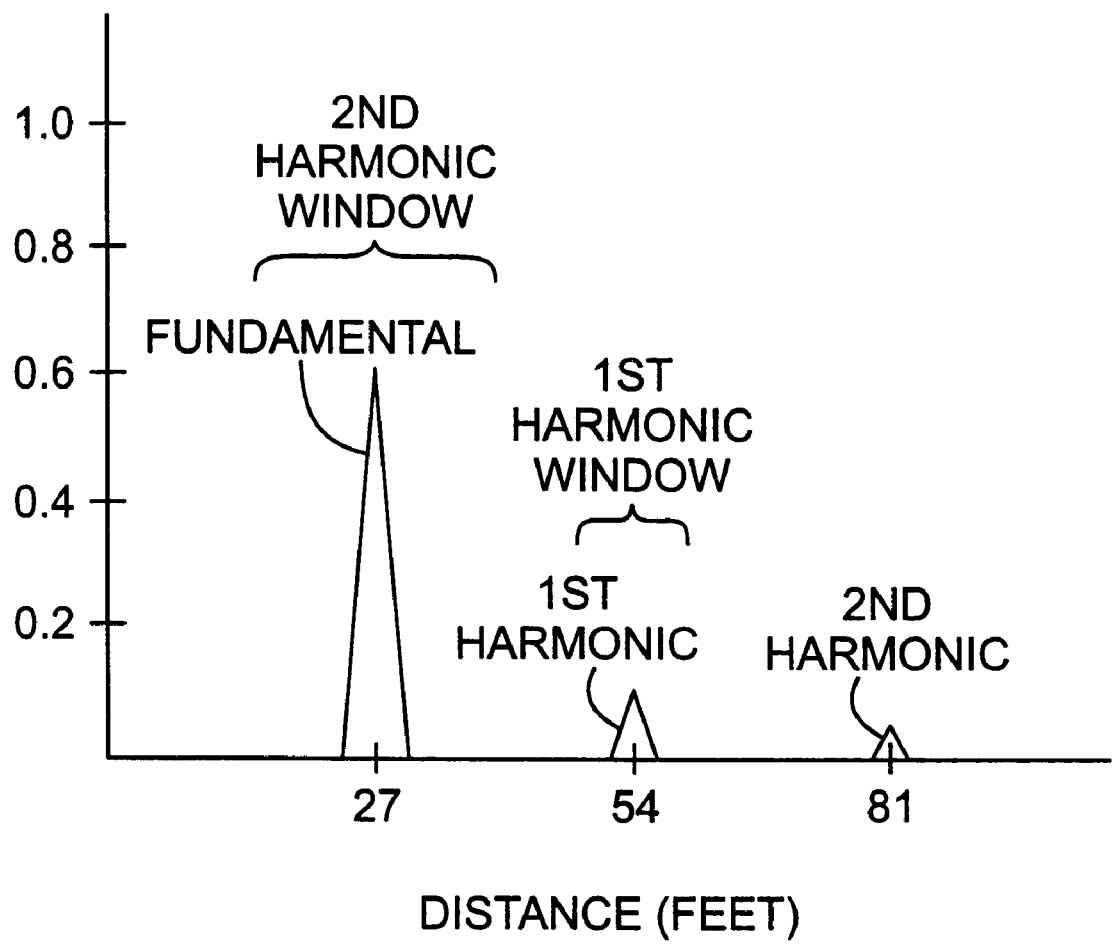
FIG. 9 shows a portion of the reflected sweep response spectrum of FIG. 8 in greater detail.

As shown in FIG. 7, the reflected sweep signal response for an unterminated 27 foot transmission line may be represented by a hyperbolic cosine function. As a result of the reflected sweep signal response being hyperbolic, spectral analysis of the reflected sweep response signal yields the reflected sweep response spectrum shown in FIG. 8 and shown in greater detail in FIG. 9. As shown in FIG. 9, the reflected sweep response spectrum has a fundamental spectral peak FDR_$pk_{f0}$ having a frequency $f_R$ at a distance of approximately 27 feet. The reflected sweep response also includes (i) a first harmonic spectral peak FDR_$pk_{f1}$ having a frequency of $2*f_R$ at 54 feet which is a first harmonic of the fundamental spectral peak, and a second harmonic spectral peak FDR_$pk_{f2}$ having a frequency of $3*f_R$ at 81 feet which is a second harmonic of the fundamental spectral peak.

Since the first harmonic spectral peak FDR_$pk_{f1}$ and the second harmonic spectral peak FDR_$pk_{f2}$ may falsely be interpreted as faults in the transmission line, the present invention attempts to remove or suppress first harmonic spectral peaks FDR_$pk_{f1}$ and second harmonic spectral peaks FDR_$pk_{f2}$ of the reflected sweep response spectrum. The reflected sweep response spectrum may also include third, fourth, fifth, etc. harmonic spectral peaks. However, these higher harmonic spectral peaks tend to have sufficiently small enough magnitudes that they will not be mistaken as faults. Accordingly, these higher harmonic spectral peaks may typically be ignored. It should be noted, however, that the present invention could easily be extended to suppress these higher harmonics as well.

Furthermore, as shown in FIG. 9, from the standpoint of the second harmonic spectral peak FDR_$pk_{f2}$, the fundamental spectral peak FDR_$pk_{f0}$ falls within a second harmonic window of the second harmonic spectral peak FDR_$pk_{f2}$. Likewise, the first spectral peak FDR_$pk_{f1}$ falls within a first harmonic window of the second harmonic spectral peak FDR_pk$_{f2}$. It should be noted that the second harmonic spectral peak FDR_pk$_{f2}$ may be thought of as a first harmonic of the first harmonic spectral peak FDR_pk$_{f1}$.

Referring back to FIG. 4C, the harmonic suppression procedure 470 begins in step 472 with the DSP/controller 20 selecting the last spectral peak (i.e. the spectral peak corresponding to the greatest distance from the reflectometer 10). The DSP/controller 20 then determines in step 474 whether the magnitude of the selected spectral peak is greater than the noise floor for the reflectometer 10. If the magnitude of the selected spectral peak is greater than the noise floor, then the reflectometer 10 proceeds to step 476. However, if the selected spectral peak is less than the noise floor, then the reflectometer 10 proceeds to step 486 where the reflectometer 10 determines whether any more spectral peaks are available for processing. If the reflectometer 10 determines in step 486 that the harmonic suppression procedure 470 has yet to reach the first spectral peak (i.e. the spectral peak corresponding to the shortest distance from the reflectometer 10), then the reflectometer 10 proceeds to step 488 to obtain the spectral peak preceding the just processed spectral peak.

Once the DSP/controller 20 obtains a first spectral peak above the noise floor, the DSP/controller 20 determines whether the first spectral peak has a first relationship to a second spectral peak that is indicative of the first spectral peak being a first harmonic of the second spectral peak. To this end, the first DSP/controller 20 determines in step 476 whether a spectral peak above the noise floor exists in a first harmonic window of the first spectral peak. The first harmonic window includes a second spectral peak that corresponds to the distance of the first spectral peak divided by two. It should be noted that the first harmonic of a fundamental spectral peak occurs at a distance equal to twice the distance or twice the frequency of the fundamental spectral peak. As a result, if the first spectral peak is a first harmonic of the second spectral peak, then the second spectral peak should be located at the distance of the first spectral peak divided by two. However, due to the resolution of the test sweep signal and various other inaccuracies, the fundamental spectral peak may not fall exactly at the distance of the first spectral peak divided by two. Accordingly, the first harmonic window also includes the two spectral peaks to each side of the second spectral peak in order to account for the test sweep resolution and other inaccuracies.

The DSP/controller 20 then obtains a first maximum magnitude of the first group of spectral peaks that fall within the first harmonic window. If the first maximum magnitude is greater than the noise floor, then the first maximum magnitude is likely the magnitude of the fundamental spectral peak of the first spectral peak. Accordingly, the DSP/controller 20 determines in step 478 the likely effect the spectral peak corresponding to the first maximum magnitude had on the magnitude of the first spectral peak. To this end, the DSP/controller 20 multiplies the first maximum magnitude by a first harmonic factor in order to obtain a first harmonic value that is indicative of a first harmonic component contained in the first spectral peak. It should be noted that the first harmonic of a fundamental has a magnitude that is 14 dB down from the magnitude of the fundamental or that is 0.2 of the magnitude of the fundamental. As a result, the DSP/controller 20 multiplies the first maximum magnitude by 0.2 in order to obtain the first harmonic value. However, if the second maximum magnitude is not greater than the noise floor, then the DSP/controller 20 sets the first harmonic value equal to zero thus indicating that the first spectral peak is not a first harmonic of another spectral peak.

The DSP/controller 20 then determines whether the first spectral peak has a second relationship to a third spectral peak that is indicative of the first spectral peak being a second harmonic of the third spectral peak. To this end, the DSP/controller 20 determines in step 480 whether a spectral peak above the noise floor exists in a second harmonic window of the first spectral peak. The second harmonic window includes a third spectral peak that corresponds to the distance of the first spectral peak divided by three. It should be noted that the second harmonic of a fundamental spectral peak occurs at a distance equal to thrice the distance or thrice the frequency of the fundamental spectral peak. As a result, if the first spectral peak is a second harmonic of the third spectral peak, then the third spectral peak should be located at the distance of the first spectral peak divided by three. However, due to the resolution of the test sweep signal and various other inaccuracies, the fundamental spectral peak may not fall exactly at the distance of the first spectral peak divided by three. Accordingly, the second harmonic window also includes the two spectral peaks to each side of the third spectral peak in order to account for the test sweep resolution and other inaccuracies.

The DSP/controller 20 then obtains a second maximum magnitude of the second group of spectral peaks that fall within the second harmonic window. If the second maximum magnitude is greater than the noise floor, then the second maximum magnitude is likely the magnitude of the fundamental spectral peak of the first spectral peak. Accordingly, the DSP/controller 20 determines in step 482 the likely effect the spectral peak corresponding to the second maximum magnitude had on the magnitude of the first spectral peak. To this end, the DSP/controller 20 multiplies the second maximum magnitude by a second harmonic factor in order to obtain a second harmonic value that is indicative of a second harmonic component contained in the first spectral peak. It should be noted that the second harmonic of a fundamental has a magnitude that is 21 dB down from the magnitude of the fundamental or that is 0.1 of the magnitude of the fundamental. As a result, the DSP/controller 20 multiplies the second maximum magnitude by 0.1 in order to obtain the second harmonic value. However, if the second maximum magnitude is not greater than the noise floor, then the DSP/controller 20 sets the second harmonic value equal to zero thus indicating that the first spectral peak is not a second harmonic of another spectral peak.

The DSP/controller 20 then adjusts the magnitude of the first spectral peak in step 484 to account for the first spectral peak being a harmonic of another spectral peak. To this end, the DSP/controller 20 subtracts the greater of the first harmonic value and the second harmonic value from the magnitude of the first spectral peak. It should be noted that the DSP/controller 20 may subtract the value of zero from the first spectral peak if neither the first harmonic window or the second harmonic window contained a spectral peak above the noise floor, thus indicating that the first spectral peak does not contain harmonic components.

After the DSP/controller 20 adjusts the magnitude of the first spectral peak, the DSP circuit determines in step 486 whether all spectral peaks have been processed by the harmonic suppression procedure 470. To this end, the DSP/controller 20 determines whether the spectral peak corresponding to the smallest frequency or the shortest distance has been processed. If this spectral peak has yet to be been processed, then the DSP/controller 20 proceeds to step 488 in order to obtain another spectral peak for processing. Otherwise, the reflectometer 10 finishes the harmonic suppression procedure 470 by proceeding to step 430 of the transmission line analysis procedure 400.

In step 488, the DSP/controller 20 selects the spectral peak immediately preceding the spectral peak just processed. For example, if the DSP/controller 20 had just processed the $512^{th}$ spectral peak FDR_pk$_{512}$, then the DSP/controller 20 selects the $511^{th}$ spectral peak FDR_pk$_{511}$ for processing. After selecting another spectral peak for processing, the DSP/controller 20 returns to step 474 in order to process the selected spectral peak.

It will be appreciated that the above described embodiments are merely illustrative, and that those of ordinary skill in the art may readily devise their own implementations that incorporate the features of the present invention and fall within the spirit and scope thereof. For example, one skilled in the art may implement the DSP/controller 20 with various analog and/or digital circuit components that provide the functionality of the DSP/controller 20. Specifically, the DSP/controller 20 may be implemented to include a spectral analyzer circuit operable to obtain frequency components of a reflected sweep response signal, a harmonic suppression circuit operable to suppress harmonics, an attenuation compensation circuit operable to compensate for attenuation, a fault locator circuit operable to determine location of an impedance mismatch, and a severity determining circuit operable to determine severity of an impedance mismatch. Furthermore, the measurement circuit 16 may be replaced with a receiver circuit that is operable to receive the resultant sweep response circuit and extract the reflected sweep signal response therefrom.

What is claimed is:

1. A method of determining severity of impedance mismatches in a system under test, comprising the steps of:

applying a test sweep signal to said system under test in order to obtain a reflected sweep response signal from said system under test, said reflected sweep response signal representative of a frequency response of said system under test;

generating from said reflected sweep response signal a reflected sweep response spectrum that includes a plurality of spectral peaks;

determining a first attenuation compensation factor for a first spectral peak of said reflected sweep response spectrum, wherein said first spectral peak corresponds to a first distance traveled through said system under test and said first attenuation compensation factor accounts for attenuation of a plurality of signals at different frequencies traveling said first distance through said system under test;

adjusting said reflected sweep response spectrum for effects due to attenuation in said system under test in order to obtain an adjusted sweep response spectrum by applying said attenuation compensation factor to a first magnitude of said first spectral peak; and obtaining from said adjusted sweep response spectrum a severity of an impedance mismatch in said system under test.

2. The method of claim 1, wherein said applying step includes the step of:

multiplying said first magnitude of said first spectral peak by said first attenuation compensation factor.

3. The method of claim 1, further comprising the step of:

determining that said first magnitude of said first spectral peak is greater than a noise floor level.

4. The method of claim 1, wherein said determining step includes the steps of:

obtaining a second attenuation compensation factor for a second distance traveled through said system under test; and determining said first attenuation compensation factor by interpolating from said second attenuation compensation factor.

5. The method of claim 1, wherein said determining step includes the steps of:

obtaining from an attenuation compensation table a second attenuation compensation factor for a second distance traveled through said system under test; and determining said first attenuation compensation factor by interpolating from said second attenuation compensation factor.

6. The method of claim 1, wherein said determining step includes the steps of:

calculating a second attenuation compensation factor for a second distanced traveled in said system under test; and determining said first attenuation compensation factor by interpolating from said second attenuation compensation factor.

7. The method of claim 1, wherein said determining step includes the step of:

calculating said first attenuation compensation factor by averaging a plurality of attenuation factors for said system under test, wherein each attenuation factor of said plurality of attenuation factors corresponds to said first distance and a different frequency.

8. The method of claim 1, wherein:

said applying step includes the step of sweeping said test sweep signal across a frequency span; and said determining step includes the step of calculating said first attenuation compensation factor by averaging a plurality of attenuation factors across said frequency span, wherein each attenuation factor of said plurality of attenuation factors corresponds to said first distance and a different frequency.

9. A reflectometer for determining severity of impedance mismatches in a system under test, comprising:

a connector configured to couple said system under test to said reflectometer;

a transmitter circuit coupled to said connector and configured to apply a test sweep signal to said connector and said system under test coupled thereto;

a receiver circuit coupled to said connector and configured to obtain a reflected sweep response signal from a resultant response signal that includes (i) said test sweep signal from said transmitter circuit and (ii) said reflected sweep response signal received from said system under test coupled to said connector, said reflected sweep response signal representative of a frequency response of said system under test;

a spectral analyzer coupled to said receiver circuit, said spectral analyzer configured to generate from said reflected sweep response signal a reflected sweep response spectrum that includes a plurality of spectral peaks;

an attenuation compensation circuit coupled to said spectral analyzer, said attenuation compensation circuit configured to (i) determine a first attenuation compensation factor for a first spectral peak of said reflected sweep response spectrum, said first spectral peak corresponding to a first distance traveled through said system under test and said first attenuation compensation factor accounting for attenuation of a plurality of signals at different frequencies traveling said first distance through said system under test, and (ii) adjust said reflected sweep response spectrum for effects due to attenuation in said system under test in order to obtain an adjusted sweep response spectrum by applying said attenuation compensation factor to a first magnitude of said first spectral peak; and a severity determining circuit coupled to said attenuation compensation circuit and configured to determine a severity of an impedance mismatch in said system under test from said adjusted sweep response spectrum.

10. The reflectometer of claim 9, wherein:

said attenuation compensation circuit is further configured to multiply said first magnitude of said first spectral peak by said first attenuation compensation factor.

11. The reflectometer of claim 9, wherein:

said attenuation compensation circuit is further configured to determine that said first magnitude of said first spectral peak is greater than a noise floor level.

12. The reflectometer of claim 9, wherein:

said attenuation compensation circuit is further configured to (i) obtain a second attenuation compensation factor for a second distance traveled through said system under test, and (ii) determine said first attenuation compensation factor by interpolating from said second attenuation compensation factor.

13. The reflectometer of claim 9, further comprising an attenuation compensation table that includes a second attenuation compensation factor for a second distance traveled through said system under test, wherein:

said attenuation compensation circuit is further configured to (i) obtain said second attenuation compensation factor from said attenuation compensation table, and (ii) determine said first attenuation compensation factor by interpolating from said second attenuation compensation factor.

14. The reflectometer of claim 9, wherein:

said attenuation compensation circuit is further configured to calculate said first attenuation compensation factor by averaging a plurality of attenuation factors for said system under test, each attenuation factor of said plurality of attenuation factors corresponding to said first distance and a different frequency.

15. The reflectometer of claim 9, wherein:

said transmitter is further configured to sweep said test sweep signal across a frequency span; and said attenuation compensation circuit is further configured to calculate said first attenuation compensation factor by averaging a plurality of attenuation factors across said frequency span, each attenuation factor of said plurality of attenuation factors corresponding to said first distance and a different frequency.

16. A reflectometer for determining severity of impedance mismatches in a system under test, comprising:

a connector configured to couple said system under test to said reflectometer;

a transmitter circuit coupled to said connector and configured to apply a test sweep signal to said connector and said system under test coupled thereto;

a measurement circuit coupled to said connector and configured to generate a plurality of measurement signals indicative of a resultant response signal that includes (i) said test sweep signal from said transmitter circuit and (ii) a reflected sweep response signal received from said system under test coupled to said connector, said reflected sweep response signal representative of a frequency response of said system under test;

an analog to digital (A/D) converter coupled to said measurement circuit and configured to generate from said plurality of measurement signals a digitized resultant response signal that is a digital representation of said resultant response signal; and a digital signal processing (DSP) circuit coupled to said A/D converter, said DSP circuit configured to (i) obtain said reflected sweep response signal from said digitized resultant response signal, (ii) generate from said reflected sweep response signal a reflected sweep response spectrum that includes a plurality of spectral peaks; (iii) determine a first attenuation compensation factor for a first spectral peak of said reflected sweep response spectrum, said first spectral peak corresponding to a first distance traveled in said system under test and said first attenuation compensation factor accounting for attenuation of a plurality of signals at different frequencies traveling said first distance through said system under test, (iv) adjust said reflected sweep response spectrum for effects due to attenuation in said system under test in order to obtain an adjusted sweep response spectrum by applying said attenuation compensation factor to a first magnitude of said first spectral peak, and (v) determine a severity of an impedance mismatch in said system under test from said adjusted sweep response spectrum.

17. The reflectometer of claim 16, wherein:

said DSP circuit is further configured to multiply said first magnitude of said first spectral peak by said first attenuation compensation factor.

18. The reflectometer of claim 16, wherein:

said DSP circuit is further configured to determine that said first magnitude of said first spectral peak is greater than a noise floor level.

19. The reflectometer of claim 16, wherein:

said DSP circuit is further configured to (i) obtain a second attenuation compensation factor for a second distance traveled through said system under test, and (ii) determine said first attenuation compensation factor by interpolating from said second attenuation compensation factor.

20. The reflectometer of claim 16, further comprising an attenuation compensation table that includes a second attenuation compensation factor for a second distance traveled through said system under test, wherein:

said DSP circuit is further configured to (i) obtain said second attenuation compensation factor from said attenuation compensation table, and (ii) determine said first attenuation compensation factor by interpolating from said second attenuation compensation factor.

21. The reflectometer of claim 16, wherein:

said DSP circuit is further configured to (i) calculate a second attenuation compensation factor for a second distanced traveled in said system under test, and (ii) determine said first attenuation compensation factor by interpolating from said second attenuation compensation factor.

22. The reflectometer of claim 16, wherein:

said DSP circuit is further configured to calculate said first attenuation compensation factor by averaging a plurality of attenuation factors for said system under test, each attenuation factor of said plurality of attenuation factors corresponding to said first distance and a different frequency.

23. The reflectometer of claim 16, wherein:

said transmitter is further configured to sweep said test sweep signal across a frequency span; and said DSP circuit is further configured to calculate said first attenuation compensation factor by averaging a plurality of attenuation factors across said frequency span, each attenuation factor of said plurality of attenuation factors corresponding to said first distance and a different frequency.

* * * * *